(12) United States Patent
Werner et al.

(10) Patent No.: US 9,443,998 B2
(45) Date of Patent: Sep. 13, 2016

(54) MULTI-LAYER-COATED QUANTUM DOT BEADS

(71) Applicant: Nanoco Technologies, Ltd., Manchester (GB)

(72) Inventors: Matthew Werner, Liverpool (GB); Nathalie Gresty, Cheshire (GB); Nigel Pickett, Manchester (GB); Paul Chalker, Wirral (GB); James Harris, Manchester (GB); Imad Naasani, Manchester (GB)

(73) Assignee: Nanoco Technologies Ltd. (GB)

( * ) Notice: Subject to any disclaimer, the term of this patent is extended or adjusted under 35 U.S.C. 154(b) by 0 days.

(21) Appl. No.: 14/208,311

(22) Filed: Mar. 13, 2014

(65) Prior Publication Data
US 2014/0264196 A1  Sep. 18, 2014

Related U.S. Application Data

(60) Provisional application No. 61/781,323, filed on Mar. 14, 2013.

(51) Int. Cl.
*C09K 11/00* (2006.01)
*H01L 31/00* (2006.01)
(Continued)

(52) U.S. Cl.
CPC ....... *H01L 31/035218* (2013.01); *C09K 11/00* (2013.01); *C09K 11/02* (2013.01); *C09K 11/08* (2013.01); *C09K 11/565* (2013.01); *C09K 11/70* (2013.01); *C23C 16/30* (2013.01); *C23C 16/403* (2013.01); *C23C 16/442* (2013.01); *C23C 16/4417* (2013.01); *C23C 16/45527* (2013.01); *C23C 16/45531* (2013.01); *B82Y 30/00* (2013.01); *H01L 29/12* (2013.01); *H01L 31/0256* (2013.01); *H01L 33/501* (2013.01); *H01L 33/502* (2013.01); *H01L 2224/48091* (2013.01); *H01L 2924/12044* (2013.01); *Y10S 977/774* (2013.01)

(58) Field of Classification Search
CPC ..... C09K 11/02; C09K 11/025; C09K 11/70; C09K 11/565; C09K 11/883; H01L 33/504; H01L 29/06; H01L 31/00
USPC .................... 252/500, 519.33, 518.1; 257/13
See application file for complete search history.

(56) References Cited

U.S. PATENT DOCUMENTS 7,588,828 B2   9/2009  Mushtaq et al.
7,803,423 B2   9/2010  O'Brien et al.
(Continued)

OTHER PUBLICATIONS

Ziegler, Jan et al. Silica-Coated InP/ZnS Nanocyrstals as Converter Material in White LEDs**, Advanced Materials, DOI: 10.1002/adma.200800724, © 2008 Wiley-VCH Verlag GmbH & Co. KGaA, Weinheim, pp. 4068-4073.
(Continued)

*Primary Examiner* — Khanh Tuan Nguyen
*Assistant Examiner* — Haidung Nguyen
(74) *Attorney, Agent, or Firm* — Blank Rome, LLP

(57) ABSTRACT

Disclosed herein are coated beads made of a primary matrix material and containing a population of quantum dot nanoparticles. Each bead has a multi-layer surface coating. The layers can be two or more distinct surface coating materials. The surface coating materials may be inorganic materials and/or polymeric materials. A method of preparing such particles is also described. The coated beads are useful for composite materials for applications such as light-emitting devices.

29 Claims, 18 Drawing Sheets

(51) Int. Cl.

| | | |
|---|---|---|
| *H01L 31/0352* | (2006.01) | |
| *C23C 16/455* | (2006.01) | |
| *C09K 11/08* | (2006.01) | |
| *C09K 11/02* | (2006.01) | |
| *C09K 11/56* | (2006.01) | |
| *C09K 11/70* | (2006.01) | |
| *C23C 16/30* | (2006.01) | |
| *C23C 16/40* | (2006.01) | |
| *C23C 16/44* | (2006.01) | |
| *C23C 16/442* | (2006.01) | |
| *B82Y 30/00* | (2011.01) | |
| *H01L 31/0256* | (2006.01) | |
| *H01L 29/12* | (2006.01) | |
| *H01L 33/50* | (2010.01) | |

(56) References Cited

U.S. PATENT DOCUMENTS

| | | |
|---|---|---|
| 7,867,556 B2 | 1/2011 | Pickett |
| 2010/0113813 A1 | 5/2010 | Pickett et al. |
| 2010/0123155 A1 | 5/2010 | Pickett et al. |
| 2010/0167011 A1 | 7/2010 | Dubrow |
| 2011/0068321 A1 | 3/2011 | Pickett et al. |
| 2011/0068322 A1 | 3/2011 | Pickett et al. |
| 2011/0241229 A1 | 10/2011 | Naasani et al. |

OTHER PUBLICATIONS

Shen, Lei, Biocompatible Polymer/Quantum Dots Hybrid Materials: Current Status and Future Developments, Journal of Functional Biomaterials, ISSN 2079-4983, www.mdpi.com/journal/jfb, published Dec. 2, 2011, p. 355-372.

English translation of Korean Office Action mail date Mar. 29, 2016, received in corresponding patent application No. 10-2015-7029012.

A.A. Dameron, S.D. Davidson, B.B. Burton, P.F. Carcia, R.S. McLean and S.M. George, J. Phys. Chem. C, 2008, 122, 4573.

A.A. Dameron, D. Seghete, B.B. Burton, S.D. Davidson, A.S. Cavanagh, J.A. Bertrand and S.M. George, Chem. Mater., 2008, 20, 3315.

Chem. Vapor Deposition, 2005, 11, 420 and Am. Ceram. Soc., 2009, 92, 649.

P. A. Williams, C. P. Ireland, P. J. King, P. A. Chater, P. Boldrin, R. G. Palgrave, J. B. Claridge, J. R. Darwent, P. R. Chalkera and M. J. Rosseinsky, Journal of Materials Chemistry 2012, 22, 20203.

Xinhua Liang, David M. King, zPeng Li, and Alan W. Weimerw, J. Am. Ceram. Soc., 92 [3] 649-654 (2009).

MULTI-LAYER-COATED QUANTUM DOT BEADS

FIELD OF THE INVENTION

The present invention relates to semiconductor nanoparticle-based materials, particularly, but not exclusively, quantum dot-containing beads for use in the fabrication of quantum dot-based light-emitting devices. The invention further relates to processes for semiconductor nanoparticle-based materials.

BACKGROUND

There has been substantial interest in exploiting the properties of compound semiconductors consisting of particles with dimensions in the order of 2-50 nm, often referred to as quantum dots (QDs), nanoparticles, and/or nanocrystals. These materials are of commercial interest due to their size-tuneable electronic properties which can be exploited in many commercial applications such as optical and electronic devices and other applications that ranging from biological labelling, photovoltaics, catalysis, biological imaging, light-emitting diodes (LEDs), general space lighting and electroluminescent displays amongst many new and emerging applications.

The most studied of semiconductor materials have been the chalcogenides, II-VI materials namely ZnS, ZnSe, CdS, CdSe, CdTe; most notably CdSe due to its size-dependent tuneability over the visible region of the spectrum. Reproducible methods for the large scale production of these materials have been developed from "bottom up" techniques, whereby particles are prepared atom-by-atom, i.e. from molecules to clusters to particles, using "wet" chemical procedures.

Two fundamental factors, both related to the size of the individual semiconductor nanoparticle, are responsible for their unique properties. The first is the large surface area to volume ratio. Smaller particles have a larger ratio of surface atoms to non-surface atoms than larger particles. Thus, surface properties play a more important role in the overall properties of smaller particles. A second factor is that quantum confinement effects in small particles influence the electronic properties of the material in a size-dependent manner. The band gap gradually becomes larger as the size of the particle decreases. This effect is a consequence of the confinement of an "electron in a box", giving rise to discrete energy levels similar to those observed in atoms and molecules, rather than a continuous band as observed in the corresponding bulk semiconductor material. Thus, for a semiconductor nanoparticle, the "electron and hole" produced by the absorption of electromagnetic radiation are closer together than they would be in the corresponding macrocrystalline material. As a consequence, Coulombic interaction cannot be neglected. This leads to a narrow bandwidth emission peak that is dependent upon the particle size and composition of the nanoparticle material. Thus, quantum dots have higher kinetic energy than the corresponding macrocrystalline material and, consequently, the first excitonic transition (band gap) increases in energy with decreasing particle diameter.

As used herein, the term "core semiconductor nanoparticle" and "core nanoparticle" refers to a nanoparticle of a single semiconductor material possibly coated by an organic passivating layer. Such core semiconductor nanoparticles tend to have relatively low quantum efficiencies due to electron-hole recombination occurring at defects and dangling bonds situated on the nanoparticle surface, resulting in non-radiative electron-hole recombinations. One method to eliminate defects and dangling bonds on the inorganic surface of the quantum dot is to grow a "shell" inorganic material on the core nanoparticle, producing a "core/shell" nanoparticle. The shell inorganic material preferably has a wider band gap than that of the core material and a lattice that matches closely with that of the core material. Core/shell particles separate charge carriers confined in the core from surface states that would otherwise act as non-radiative recombination centres. One example is a ZnS shell grown on the surface of a CdSe core. Another approach is to prepare a core/multishell structure where the "electron-hole" pair is confined to a single shell layer consisting of a few monolayers of a specific material, forming a quantum dot-quantum well structure. Here, the core is of a wide band gap material, followed by a thin shell of narrower band gap material, and capped with a further wide band gap layer, such as CdS/HgS/CdS grown using substitution of Hg for Cd on the surface of the core nanocrystal to deposit just a few monolayers of HgS, which is then over grown by a monolayer of CdS. The resulting structures exhibit clear confinement of photo-excited carriers in the HgS layer. To add further stability to quantum dots and help to confine the electron-hole pair one of the most common approaches is to grow a compositionally graded alloy layer on the core, which helps to alleviate strain resulting from the lattice mismatch between the core and shell materials that could otherwise lead to defects. Moreover, for a CdSe core, in order to improve structural stability and quantum yield, rather than growing a shell of ZnS directly on the core, a graded alloy layer of $Cd_{1-x}Zn_xSe_{1-y}S_y$ can be used. This has been found to greatly enhance the photoluminescence emission of the quantum dots.

The emission and absorption properties of nanoparticles can be manipulated by doping nanoparticles with atomic impurities. Procedures for doping wide band gap materials, such as zinc selenide and zinc sulfide, with manganese and copper (ZnSe:Mn or ZnS:Cu) have been developed. Doping with different luminescence activators in a semiconducting nanocrystal can be used to tune the photoluminescence and electroluminescence at energies even lower than the band gap of the bulk material, whereas the quantum size effect can be used to tune the excitation energy with the size of the quantum dots without having a significant change in the energy of the activator related emission.

A particularly attractive potential field of application for quantum dots is in the development of next generation LEDs. LEDs are becoming increasingly important in modern day life and it is envisaged that they have the potential to become one of the major applications for quantum dots, in for example, automobile lighting, traffic signals, general lighting, liquid crystal display (LCD) backlight units (BLUs) and display screens.

Currently, LED devices are made from inorganic solid-state compound semiconductors, such as AlGaAs (red), AlGaInP (orange-yellow-green), and AlGaInN (green-blue). However, solid-state LEDs that emit white light cannot be produced using available solid-state compound semiconductors. Moreover, it is difficult to produce "pure" colours by combining solid-state LEDs of different frequencies. At present, the main method of colour mixing to produce a required colour, including white, is to use a combination of phosphorescent materials placed on top of a solid-state LED. In such a configuration the light from the LED (the "primary light") is absorbed by the phosphorescent material and then re-emitted at a second frequency (the "secondary light"). In other words, the phosphorescent materials down-convert the primary light to secondary light. White LEDs produced by phosphor down-conversion cost less and are simpler to fabricate than combinations of solid-state red-green-blue LEDs.

Current phosphorescent materials used in down-converting applications absorb predominantly UV or blue light and convert it to longer wavelengths. Most current phosphors are based on trivalent rare-earth-doped oxides or halophosphates. White emission can be obtained by blending phosphors that emit in the blue, green and red regions and stimulating such a blend with a blue or UV emitting solid-state device. A blue LED in combination with a green phosphor, such as $SrGa_2S_4:Eu_2^+$, and a red phosphor, such as $SrSiEu_2^+$, or a UV LED in combination with a yellow phosphor, such as $Sr_2P_2O_7:Eu_2^+$; $Mn_2^+$, and a blue-green phosphor can produce white light. White LEDs can also be made by combining a blue LED with a yellow phosphor, but colour control and colour rendering is poor due to lack of tunability of the LEDs and the phosphor. Unfortunately, conventional LED phosphor technology used as down-converting materials produce light having poor colour rendering (i.e. a colour rendering index (CRI) <75).

The use of nanoparticle quantum dots potentially has some significant advantages over the use of the more conventional phosphors. One advantage is the ability to tune the emission wavelength of the nanoparticle phosphor by manipulating the particle size. Additionally, nanoparticle quantum dots exhibit strong absorption properties, narrow emission bandwidth, and low scattering if the quantum dots are monodispersed. Rudimentary quantum dot-based light-emitting devices have been made by embedding colloidally produced quantum dots in an optically transparent (or sufficiently transparent) LED encapsulation medium, such as a silicone or an acrylate, which is then placed on top of a solid-state LED. Such encapsulation media are often permeable to oxygen, which degrades the performance of the quantum dots.

Multi-layer gas-barrier coatings can be formed via atomic layer deposition (ALD). For example alternating $Al_2O_3$ (deposited by ALD) and $SiO_2$ (deposited by rapid, Al-catalysed ALD) layers on Kapton (poly(4,4'-oxydipenylene-pyromellitimide)) has been reported. [A. A. Dameron, S. D. Davidson, B. B. Burton, P. F. Carcia, R. S. McLean and S. M. George, *J. Phys. Chem. C*, 2008, 122, 4573] However, the reported water vapour transmission rate (WVTR) was not improved beyond that of a single-layer ALD $Al_2O_3$ gas-barrier. The same group described the MLD of poly (aluminium ethylene glycol) films on $Al_2O_3$ surfaces (deposited by ALD), using trimethyl aluminium (TMA) and ethylene glycol (EG) precursors. [A. A. Dameron. D. Seghete, B. B. Burton, S. D. Davidson, A. S. Cavanagh, J. A. Bertrand and S. M. George, *Chem. Mater.*, 2008, 20, 3315] The hybrid inorganic-organic polymer (alucone) film was found to be unstable in ambient conditions, with a decrease in film thickness commencing around 150 hours post-deposition.

For the commercial application of quantum dots in next-generation light-emitting devices, the quantum dots should be incorporated into the LED encapsulating material while remaining as fully monodispersed as possible and without significant loss of quantum efficiency. The methods developed to date are problematic, not least because of the nature of current LED encapsulants. Quantum dots can agglomerate when formulated into current LED encapsulants, thereby reducing the optical performance of the quantum dots. Moreover, even after the quantum dots have been incorporated into the LED encapsulant, oxygen can still migrate through the encapsulant to the surfaces of the quantum dots, which can lead to photo-oxidation and, as a result, a drop in quantum yield (QY).

The widespread exploitation of quantum dot nanoparticles has been restricted by the nanoparticle's physical/chemical instability and incompatibility with many of the materials involved in such exploitation, such as solvents, inks, polymers, glasses, metals, electronic materials, electronic devices, bio-molecules and cells. Consequently, significant challenges to the development of quantum dot-based materials and methods for fabricating quantum dot-based devices, such as light-emitting devices, on an economically viable scale and which would provide sufficiently high levels of performance to satisfy consumer demand.

SUMMARY

The materials and methods described herein obviate or mitigate one or more of the above problems with semiconductor nanoparticle-based materials and/or current methods for fabricating such materials. Disclosed herein is a plurality of coated primary particles and a process for coating said primary particles. The primary particles feature a bead made of a primary matrix material and a population of semiconductor nanoparticles incorporated into the primary matrix material. The primary particles are coated with at least one layer of a surface coating material.

Such particles are robust, and consequently, are suited for a wide range of applications, such as serving as a secondary light sources in semiconductor nanoparticle-based LEDs. By providing the primary particles with coatings, the primary particles remain as separate, individual particles, which can be manipulated and used as separate particles. But by virtue of the coating, the particles are less sensitive to their surrounding environment and subsequent processing steps.

In one embodiment a plurality of quantum dots are incorporated into one or more silica beads (primary matrix material) whose surface has been treated with an acrylate monomer and subsequently polymerised to provide a polymeric surface barrier layer. The beads are then coated with one or more coatings, as described below.

In further embodiments, a process of coating powder-like materials, using ALD with a pulsed method of agitation, is described. In some embodiments, the powder-like material comprises QD-beads. The apparatus used for the described process includes sintered filters placed at the top and bottom of a reaction chamber containing the powder-like material to be coated. Agitation pulses are injected simultaneously to the ALD precursor pulses (all precursors) allowing the process gas to pass around the grains at the point where there is minimum contact between adjacent powder-like grains, thus minimizing the formation of contact points within the coating. The precursor and agitation pulses must be sufficiently long to enable the entire surface of each grain to be coated. Using a pulsed agitation process, the quantity of inert gas used is substantially reduced in comparison to a conventional fluidised bed process.

The coated beads are then embedded or entrapped within a host LED encapsulation material such as a silicone, an epoxy resin, a (meth)acrylate or another polymeric material. Such an arrangement is depicted schematically in FIG. 1, wherein an LED (1), which is arranged to emit blue primary light (2) upon the application of current, is submerged in a commercially available LED encapsulant (3) in which is embedded a plurality of quantum dot-containing silica beads (4), (5) provided with a polyacrylate protective surface coating; some of the beads (4) contain quantum dots that emit red secondary light (6) upon excitation by the blue primary light from the LED (1), and the remaining beads (5) contain quantum dots that emit green secondary light (7) upon excitation by the blue primary light from the LED (1).

DESCRIPTION

Figure 1:
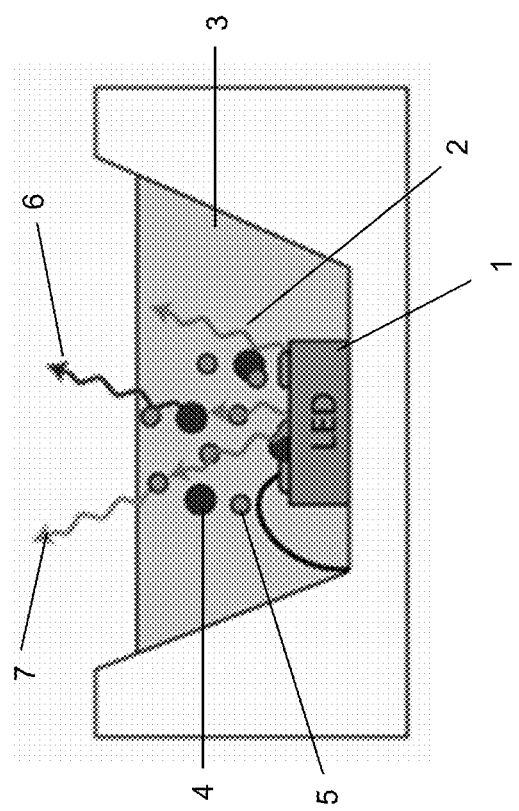
FIG. 1 is a diagram showing the arrangement of quantum dot-containing beads in an LED encapsulant, in optical communication with a solid-state LED primary light source, to form a light-emitting device.

Methods to encapsulate quantum dots in polymers are disclosed in the applicant's co-pending U.S. Patent Application Publication Nos. 2010/0123155 (published May 20, 2010) and 2011/0068321 (published Mar. 24, 2011). The contents of each of those publications are incorporated herein by reference. The term "bead" is used herein for convenience and is not intended to impose any particular size or shape limitation to the material described as a "bead". Thus, for example, the beads may be spherical but other configurations are possible. Where reference is made herein to "microbeads" this is intended to refer to "beads" as defined above having a dimension on the micron scale. Likewise, the terms "bead", "microbead", and "primary particle" are used interchangeably. Moreover, the terms "nanocrystal," "nanoparticle," "quantum dot," and "QD" are used interchangeably. The terms "QD-bead," "quantum dot-bead," etc. refer to beads of a primary matrix material incorporating QDs within the beads.

The term "coating" is used herein to refer to one or more layers of material provided on another material, which may partially or fully cover the exterior surface or solvent accessible surface of that other material. The material of the "coating" may penetrate at least partially into the internal structure of the material to which it has been applied, provided the coating still affords a level of protection or functions in some way as a barrier to the passage of potentially deleterious species, e.g. oxygen, moisture, and/or free radicals, through the coated material. In addition, in some embodiments the coating material imparts additional functionality such as reducing the sensitivity of the quantum dot-containing beads to heat. It will be appreciated from the wording used herein that the "coating" applied to each primary particle results in the production of a plurality of separate, distinct coated primary particles rather than a plurality of particles contained or encapsulated within the same, unitary matrix-type material, such as a plurality of resin beads dispersed throughout an LED encapsulant. The primary particles themselves typically contain a plurality of quantum dots.

Numerous methods to deposit layers of gas-barrier materials, to preserve the integrity of optoelectronic devices are known, including chemical vapour deposition (CVD), physical vapour deposition (PVD) (including magnetron sputtering), Vitex technology, atomic layer deposition (ALD), and molecular layer deposition (MLD). Gas-barrier properties are defined in terms of their gas permeation rates; most commonly, the effectiveness of a gas-barrier is characterised by its oxygen transmission rate (OTR) and water vapour transmission rate (WVTR). For LCD/LED displays, OTR and WVTR values in the approximate ranges $10^{-2}$-$10^{1}$ $cm^3$ $m^{-2}$ $day^{-1}$ and $10^{-2}$-$10^{-1}$ g $m^{-2}$ $day^{-1}$, respectively, are desired.

CVD involves the formation of a solid film via the adsorption and chemical reaction, on the substrate surface, of reactant species in the vapour-phase. The process is partially surface controlled, but also dependent on the processing condition. Advantages include a high growth rate, but for the deposition of gas-barrier films, precise control over the reaction flux composition is required to achieve a uniform, homogeneous film on a flat substrate. Conformal coatings on three-dimensional (3D) structures are very difficult to achieve using CVD.

PVD is a class of deposition techniques involving the formation of a solid film via condensation of the film constituents on the substrate surface. In the deposition of gas-barrier films onto optoelectronic devices, magnetron sputtering has been employed. An inert sputter gas, e.g. Ar, is converted to a plasma by glow discharge. The ions are accelerated towards a target of the deposition material by self-bias of an applied direct current. The ions' trajectory is additionally constrained by a magnetic field to increase the ion density, resulting in ejection of the target atoms by momentum transfer upon collision of the Ar ions. The high-energy target atoms travel through the plasma to the substrate surface, where they condense to form a uniform film. However, the film can incur damage due to ion bombardment, compromising its gas-barrier properties. PVD techniques are generally line-of-sight coating methods, so achieving a conformal coating on 3D structures is challenging using these methodologies.

Vitex technology was developed at the Pacific Northwest National Laboratory and subsequently commercialised by Vitex Systems, Inc. under the trade name Barix™. Vitex vacuum deposition of polymer-oxide multilayer stacks can reduce the OTR and WVTR of poly(ethylene terephthalate) (PET) substrates by up to six orders of magnitude, in comparison to those of uncoated PET. The Vitex technique has been demonstrated to encapsulate organic light-emitting diode devices with WVTRs on the order of $10^{-6}$ g $m^{-2}$ $day^{-1}$. The process is not applicable to powder-like materials, however, as the inorganic layer is sputter coated onto the substrate and the polymer layer is deposited by flash evaporation. Both of these techniques are "line of sight" making the application poorly suited to coating powder-like materials.

Figure 2:
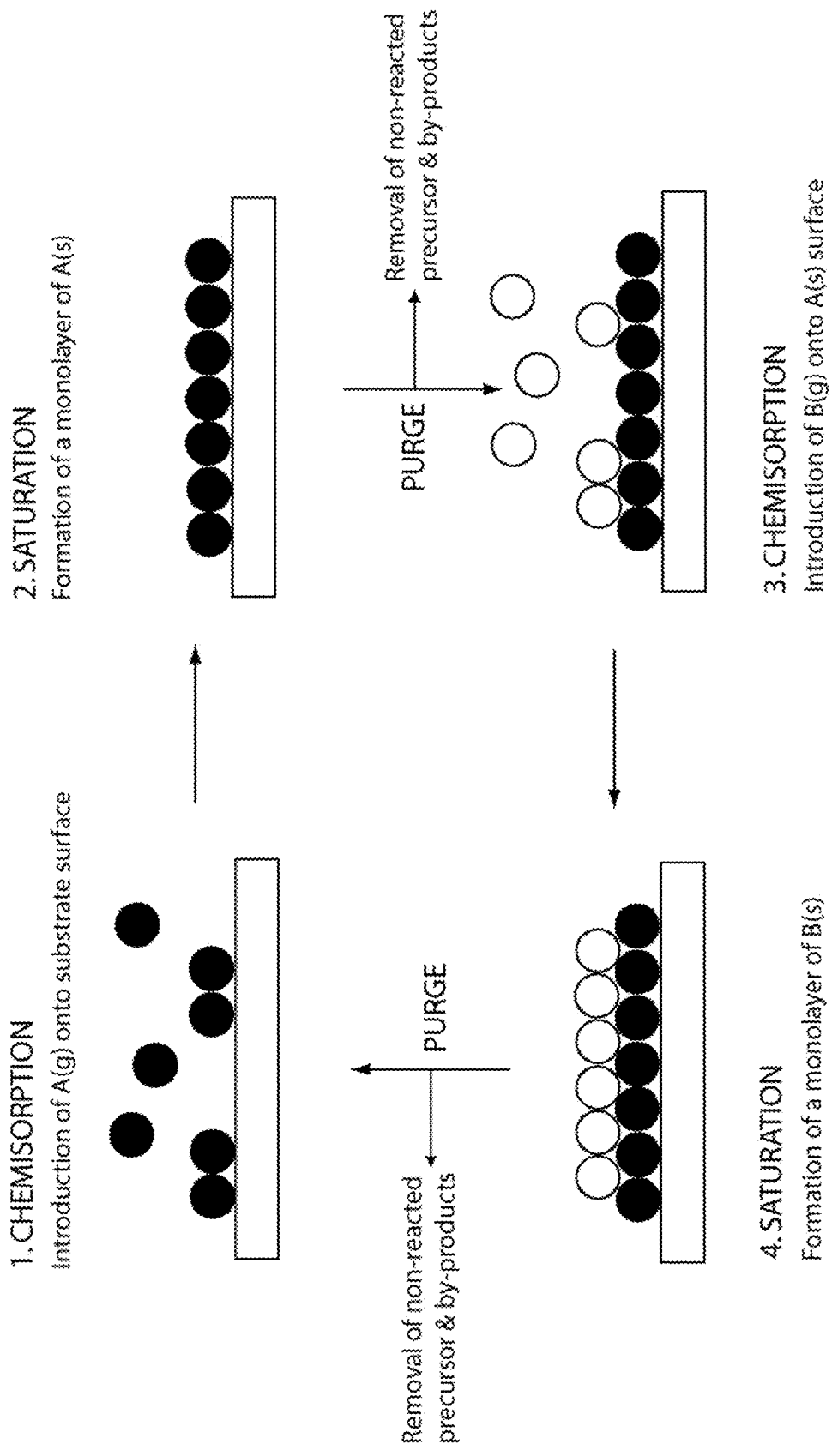
FIG. 2 illustrates atomic layer deposition (ALD).

ALD is surface-controlled method to apply a highly uniform coating to the surface of a substrate. Being a surface-controlled technique, as opposed to a line-of-sight technique, ALD is better suited for coating 3D structures than are the techniques described above. The principles of ALD are illustrated in FIG. 2. Briefly, a precursor gas, A, is introduced and chemisorbed onto the substrate surface (1) to deposit a layer of A, less any ligands removed as a reaction by-product (2). The system is then purged to remove non-reacted precursor and by-products. A precursor gas, B, is then introduced and chemisorbed on the A monolayer (3) to form a monolayer of B less any ligands removed as a reaction by-product (4). The system is again purged to remove non-reacted precursor and by-products.

Chemisorption of precursors onto the substrate surface enables strong covalent bonding, resulting in good adhesion. By using a precursor that does not react with the new surface species formed, the reaction is self-terminating (limited by steric effects and proceeding until all chemisorption sites available to the precursor are occupied), eliminating the need for extremely precise precursor dosing. The reactions are surface-controlled; therefore the film thickness is independent of substrate geometry. It is possible to deposit films of uniform composition and thickness onto 3D structures because of the surface-controlled nature of ALD. By sequentially adding precursors and purging between each addition, ALD allows the film to be built up to a desired thickness. More than one type of material can be deposited to form a multi-layered coating by adding different precursors from cycle to cycle. Purging the ALD chamber between precursor injections minimises concurrent CVD-type deposition on the substrate surface. A component of CVD-type coating on the surface of a bead may be acceptable as long as a reasonably uniform coating can be applied and a sufficient barrier produced. In practice it is hard to achieve "true" ALD with most processes. A wide range of surface coating materials have been applied using ALD in the prior art, including metal oxides, e.g. $Al_2O_3$, $SiO_2$, ZnO, $ZrO_2$ and $TiO_2$, metals, e.g. Pt and Pd, and polymers such as poly (imides).

Molecular layer deposition (MLD) applies similar principles as ALD, with the exception that MLD deposits molecular fragments during each cycle rather than atomic layers. MLD can be used to deposit organic and/or hybrid inorganic-organic polymer layers, typically functioning as spacers. The process was first developed to deposit poly (amide) and poly(imide) materials, but has since been adapted to deposit a wide range of organic polymers. For simplicity, herein, the term "ALD" will be used to refer to the deposition of both atomic and molecular fragments, i.e. both ALD and MLD processes.

Aluminum oxide ($Al_2O_3$) has been the most extensively investigated ALD-applied metal oxide gas barrier material. $Al_2O_3$ can be applied to a substrate by employing pulses of trimethylaluminium (TMA) and water vapour as the metal and oxygen sources, respectively, and purging the ALD chamber with an inert carrier gas, e.g. $N_2$ or Ar, between each precursor injection.

However, using ALD to apply $Al_2O_3$ onto organic surfaces presents a number of unique challenges. When using organic polymer substrates, the deposition temperature must be below the glass transition temperature of the polymer. Room temperature deposition is favoured for optoelectronic device manufacture. Using a plasma-assisted process, film deposition is achievable at room temperature with relatively short purging times (on the order of seconds). However, plasma-assisted ALD presents its own challenges. Film conformality must be maintained and plasma damage to the substrate must be prevented. Moreover, plasma-assisted ALD is a more "line of sight" technique, due to the recombination of radicals on surfaces, rendering it poorly suited for coating 3D structure. Transport of the reactive species through the flits needed to hold 3D structures in a reactor chamber is very limited. Also, maintaining 3D structures, such as powders, within a vacuum can be difficult. The latter is particularly problematic when coating QD-containing polymer beads, which are particulate in shape.

An ALD process can only achieve uniform coatings if the entire surface area of the material to be coated is accessible to the process gases under the correct conditions (e.g. within the ALD temperature window, transport of a saturative amount of precursor, residence time, etc.) for growth across the surface. If the powder-like material is held in a static position (mechanically, e.g. between sinters) there will be fixed contact points between adjacent grains. During the ALD process, the precursor gases will not be able to reach those areas of the surface at the contact points, therefore a proportion of the surface of each grain of powder will remain uncoated; the extent to which the surface remains uncoated may relate to the nature of the powder-like material, including properties such as the packing density. As such, a static set-up is poorly suited to any application where it is essential to coat the entire surface of a powder-like ensemble, such as the application of gas-barrier layers to QD-beads. To circumvent this issue it is generally necessary agitate the powder-like grains during the coating process to minimize the effects of contact points between particles, which would otherwise remain uncoated. One such method involves inducing a "fluidised state" within the powder-like system. Upon pumping a fluid through a bed of solid particles, the bed is transformed into a fluid-like state if the fluid is pumped at a sufficient rate to exert a force that exactly counteracts the weight of the particles. In so doing, the rigid structure of the bed in the solid state, induced by the force of gravity, is replaced by a free-flowing state in which the particles can move relatively freely with respect to one another as they would in a fluid.

One approach to coating powders is to hold the powder static due to gravity (resulting in contact points) during the ALD precursor pulses, then disrupt during the purge step of one of the precursors by pulses of inert gas, before allowing the powder grains to settle and subsequently introducing the next ALD cycle. See *J. Mater. Chem.*, 2012, 22, 20203. Such approaches result in variable contact points. The coating produced during each ALD cycle contains holes at the contact points. By carrying out a sufficient number of ALD cycles, it could be possible to completely cover the entire surface of each powder grain. Despite reports that the method produces completely smooth coatings, when observed by higher resolution scanning tunneling microscopy (SEM) any such coating is unlikely to be completely uniform, due to fluctuations in film thickness depending on the reorientation and redistribution of powder grains following each cycle. This method is also poorly suited to the application of very thin coatings as it relies on a minimum number of cycles to eliminate all contact points. The number of cycles required to cover the entire surface would be subject to statistical fluctuations, limiting the reproducibility of the method.

Other methods for coating powder-like materials by ALD utilize a fluidized bed reactor chamber to disrupt the powder grains throughout the ALD coating process. See *Chem. Vapor Deposition,* 2005, 11, 420 and *Am. Ceram. Soc.,* 2009, 92, 649. With existing fluidized bed set-ups the powder is typically placed in the bottom of a vertically mounted reactor tube chamber, with sintered filter elements at both the top and bottom of the reactor chamber to allow the passage of gases, but not the powder grains, through the reaction chamber. As described previously, an inert gas is introduced from the bottom of the chamber to fluidize the particles. The pressure drop across the bed is approximately proportional to the increase in the superficial gas velocity. As the gas flow increases, frictional forces act on the powder grains to cause lift. As the frictional force acting on a powder grain reaches equilibrium with the force of gravity, the grain becomes suspended. Eventually, there will come a point where the entire bed of powder grains is suspended, known as the minimum fluidisation point. Further increases in gas velocity serve to expand the bed. In certain particle systems, particularly where the particles are fluidised with a gas, once the gas flow exceeds the minimum fluidisation point, bubbling can occur. Powder-like materials are commonly subjected to a constant gas flow to create a homogeneous fluidised bed, with the simultaneous introduction of precursor pulses at set times (as in a standard ALD process). The tendency for adjacent powder-like grains to interact dynamically can result in movable contact points, in which case contact points are created as the ALD precursor pulses enter the chamber.

The conformality of the ensuing coating largely depends on the residence times of the precursors. In an ALD powder-coating process, the surface area of the substrate can be very high, requiring the use of a large quantity of precursor to achieve saturation. Further, it is more difficult to purge the chamber due to the slower pumping through the powder. In combination, these two effects necessitate a long purge time and hence a long process time.

Using a fluidising bed incorporating a continuous flow of inert gas, the overall inert gas consumption is high. On a commercial scale, not only would this contribute towards the cost of the coating process, but would also require provisions for the storage and handling of large volumes of gas.

Embodiments of the processes described herein use a pulsed agitation bed, provided by concurrent pulses of an inert gas during injection of the ALD precursors. By employing short pulses of an inert gas, with a relatively high flow rate, in the place of a continuous gas flow fluidising bed, the current invention aims to reduce the gas consumption of the ALD coating process. By reducing the volume of gas consumed, its associated cost and storage provisions are reduced, thus the method may facilitate commercial scalability.

To increase the probability of separating aggregated beads and to minimise contact points it is beneficial to use the most vigorous gas flows to obtain the maximum expansion of the bed that the reactor dimensions will allow. Because it is advantageous to use the most vigorous agitation as possible, the benefit of a pulsed agitation bed over a continuous fluidising bed, in terms of the inert gas consumption, is enhanced.

One of the key advantages of fluidisation is that the bed temperature remains highly uniform, due to a high degree of mixing and the resulting high heat transfer coefficient, enabling the treatment to be applied to thermally sensitive materials. In some embodiments, the powder-like material comprises QD-beads. Due to the intrinsic fluorescence mechanism of the QDs within the beads, the optical properties of QD-beads can, in some cases, be highly sensitive to changes to temperature during coating. Thus, the application of an ALD coating using a fluidised bed, as described herein, is suitable for the treatment of QD-beads. In some embodiments, the beads are initially coated with a "primer" ALD coating to counteract problems associated with the natural tendency of the beads to aggregate. In some embodiments, the method described herein incorporates a mechanical disaggregation step, post-deposition of the primer ALD coating, to physically separate any aggregated beads and thus facilitate the plugging of any contact points within the primer coating, to form a substantially homogeneous ALD coating.

The apparatus used for the present process is similar to those using a continuous flow of gas to create a fluidising bed. Sintered filters are placed at the top and bottom of a reaction chamber, to contain the powder-like material to be coated. The geometry of the reaction chamber may influence the degree of fluidisation. The reaction chamber may take any form, which may be chosen, inter alia, according to the nature of the powder-like material to be coated and the choice of ALD precursors. In certain embodiments, the reaction chamber may be conical shaped, narrowest at the bottom, to increase the pressure exerted by the fluidising gas. In alternative embodiments, the reaction chamber may take a cylindrical (or torus) form.

According to certain embodiments, the agitation pulses are injected simultaneously to the ALD precursor pulses (all precursors) allowing the process gas to pass around the grains at the point where there is minimum contact between adjacent powder-like grains, thus minimising the formation of contact points within the coating. The precursor and agitation pulses must be sufficiently long to enable the entire surface of each grain to be coated. Using a pulsed agitation process, the quantity of inert gas used is substantially reduced.

For the application of ALD coatings to powder-like materials, such as QD-beads, long purge times are required (especially at low temperatures). By way of a non-limiting example, the purge time may be in the region of 60 times the precursor dosing time. Thus, a pulsed agitation method offers a substantial saving on inert gas consumption over a continuous flow fluidising bed.

By using pulses of inert gas at flow rates greatly in excess of the minimum fluidisation point, it may be possible to expand the bed as far as possible within the chamber, to maximise the vigour of the agitation. In so doing, the expansion of the bed, necessary to obtain a conformal coating, can be achieved while conserving the overall consumption of the fluidising gas during each ALD cycle. Further, the vigorous agitation provided by the current method, in dispersing the powder-like grains as extensively as possible throughout the ALD chamber, may improve the accessibility of the individual grain surfaces to the ALD precursors, facilitating the application of a high-quality coating.

In certain embodiments, the inert gas flow rate is within the range 300 to 6,000 sccm and the inert gas flow pulse length will fall, for example, within the range 0.1 to 5 s. However, it will be appreciated that gas flow parameters are highly reactor-specific, so the values of these parameters may differ substantially, depending on the specific reactor geometries used. It is within the ability of a person of skill in the art to determine suitable gas flow parameters for their own geometry without undue experimentation.

In some embodiments, the fluidising gas pulses are injected through the same gas lines as the ALD precursor gas pulses. By delivering the inert agitating gas pulse through the precursor lines, simultaneously to the precursor pulses, improved precursor pick-up and transport may be achieved. In alternative embodiments, the fluidising gas pulses are injected through separate lines from those delivering the ALD precursor pulses. The ALD precursor(s) may be introduced fractionally prior to, or in parallel with, the inert gas pulses, or using a combination of timings thereof.

By introducing a large quantity of inert gas into the reaction chamber approximately in parallel with each ALD precursor, a temporary increase in reactor pressure and thus the residence time of the precursor in the reaction chamber results, and increasing the time available during which precursor deposition may proceed. The method may further improve the distribution and interspersion of the precursor molecules amongst the powder-like grains.

Aggregation of the powder-like grains introduces contact points where coating does not take place. In gas-fluidised, bubbling fluidisation systems, aggregation of particles is commonly observed. While the agitated pulse method is designed to minimise the contact points and the aggregation of grains, in certain embodiments of the current invention in which the powder-like material is a QD-bead ensemble, electrostatic inter-bead interactions may lead to a certain degree of aggregation. In turn, this can lead to a substantially aggregated powder and a significant number inter-particle contact points.

In particular embodiments, an initial "primer" coat is applied to the surface of the powder-like grains, comprising a small fraction of the total number of ALD cycles to be deposited. Following the application of the primer coat, the partially-coated grains are mechanically disaggregated, resulting in a free-flowing powder with a reduced tendency towards electrostatic inter-grain aggregation, thus allowing contact points within the primer coat to be filled during further ALD cycles while minimising further contact point formation, facilitating the deposition of a highly conformal coating. The primer coat may comprise 1-500 ALD cycles, for example 5-100 cycles, or more particularly 10-40 ALD cycles.

The free-flowing powder is then returned to the ALD reactor and the coating process is resumed, in one or more stages, until the desired coating thickness is achieved, to achieve a relatively free-flowing powder with a highly conformal coating.

Figure 3:
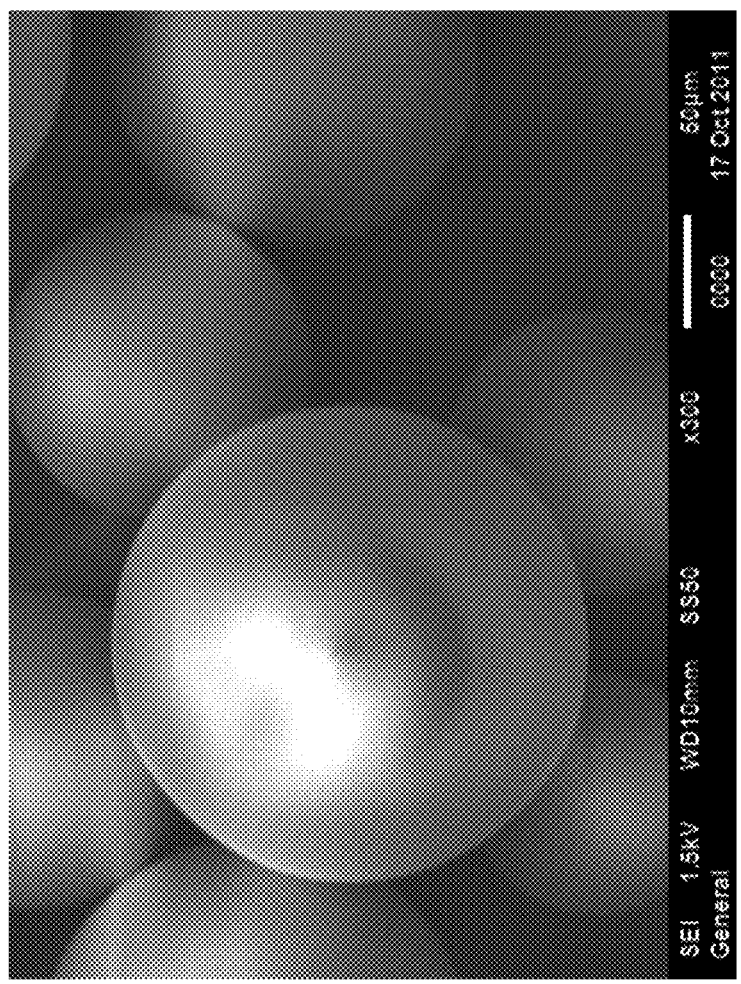
FIG. 3 shows an SEM image of uncoated beads, with a homogeneous surface.
Figure 4:
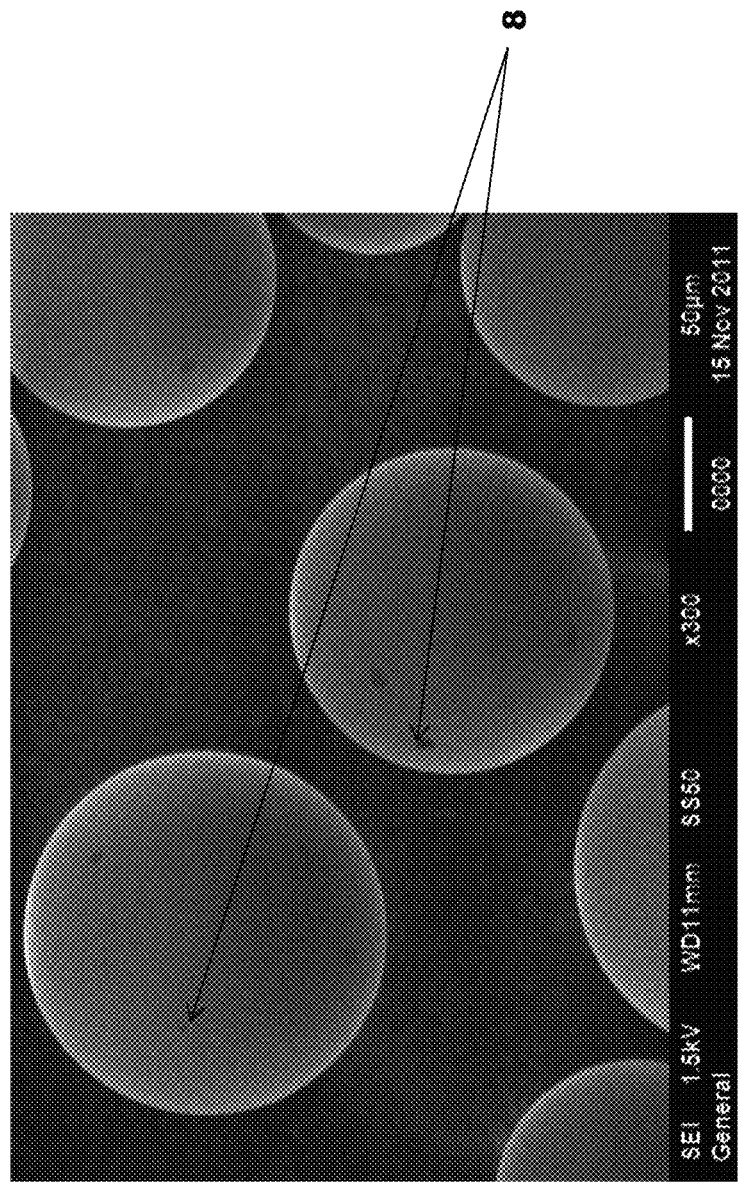
FIG. 4 shows an SEM image from same batch of beads in FIG. 3, coated with 30 ALD cycles of TMA and $H_2O$ to form an $Al_2O_3$ coating. Dark spots correspond to points with no $Al_2O_3$ coating, i.e. contact points.
Figure 5:
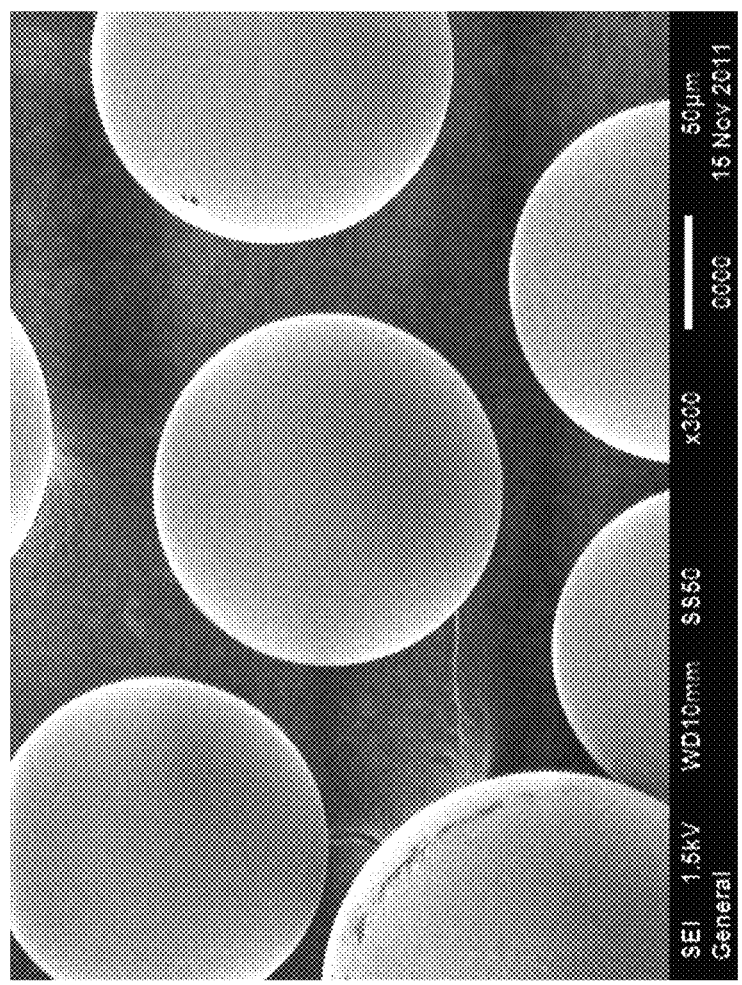
FIG. 5 shows an SEM image of the same batch of beads as in FIG. 4 following manual disaggregation and a further 235 ALD cycles, where the contact points have been alleviated.

A key advantage of the current process is the alleviation of contact points, achieved via the pulsed agitation and/or primer coat deposition and mechanical disaggregation. Issues associated with fixed contact points during the ALD coating of QD-beads are highlighted by scanning tunnelling microscopy (SEM) images in FIGS. 3-5. FIG. 3 is an SEM image of uncoated beads, with a homogeneous surface. FIG. 4 is an SEM image from same batch of beads in FIG. 3, coated with 30 ALD cycles of TMA and $H_2O$ to form an $Al_2O_3$ coating. Dark spots 8 correspond to points with no $Al_2O_3$ coating, i.e. contact points where beads have aggregated due to the surface properties of the uncoated beads. FIG. 5 is an SEM image of the same batch of beads as in FIG. 4, following mechanical disaggregation and a further 235 ALD cycles, where the contact points have been alleviated. The chance of beads sticking together following the application of a primer coat is substantially reduced because the beads are largely ALD coated.

The nanoparticle-containing primary particles (or beads) are preferably provided in the form of microbeads, but generally, the beads can be any size, depending on the application contemplated for the beads. According to certain embodiments, the diameters may range in size from about 20 nm to 500 nm, 20 nm to 100 µm, 20 nm to 500 µm in diameter, or 20 nm to about 5,000 µm. Alternatively, the primary particles may be 1 µm to about 100 µm, 1 µm to 500 µm in diameter, or 1 µm to about 5,000 µm. The primary particles may be larger or smaller than these ranges without deviating from the teachings of the disclosure. For example, the primary particles are typically within the nanometre or micrometre range, but diameters in the centimetre range are also contemplated. The primary particles are loaded with quantum dots and then provided with a barrier surface coating such as a polymer or oxide material. The coating helps stabilize the beads towards their surrounding environment and/or subsequent processing conditions. As a result, not only does handling of the quantum dots become easier, but the optical performance and lifetime of LED-based devices incorporating the bead-suspended quantum dots is improved. Moreover, the colour of light emitted by such devices can be more easily tuned. The disclosed approach is simpler than incorporating quantum dots directly into an LED encapsulant in terms of ease of colour rendering, processing, and reproducibility, and offers greater quantum dot stability to photo-oxidation and to thermal processing conditions.

The quantum dot-containing beads can be made to any desirable size. According to one embodiment the beads are the same general size as currently employed YAG phosphor materials, which range from about 10 to 100 μm, and can thus be supplied to existing LED manufacturers in a similar form to that of the current commercially used phosphor materials. Thus, the coated quantum dot-containing beads are compatible with the existing LED fabrication infrastructure.

With the advantage of very little or no loss of quantum dot QY in processing, the disclosed process of using coated quantum dot-containing beads leads to less loss of quantum efficiency than when formulating the quantum dots directly into an LED encapsulation medium or when using uncoated quantum dot beads. Because there is very little or no loss of QY it is easier to colour render and less binning is required. Colour control is very challenging when formulating quantum dots directly into an encapsulation medium due to quantum dot reabsorption, loss of QY and shifting of the photoluminescence maximum ($PL_{max}$) position. Batch-to-batch, i.e. device-to-device, reproducibility is very difficult to achieve. The disclosed process and materials provide higher quality colour of light emission, as well as easier control, and is higher reproducibility. By incorporating known amounts of quantum dots into beads and providing the beads with a protective surface coating, migration of deleterious species, such as moisture, oxygen and/or free radicals, is eliminated or reduced.

Figure 6:
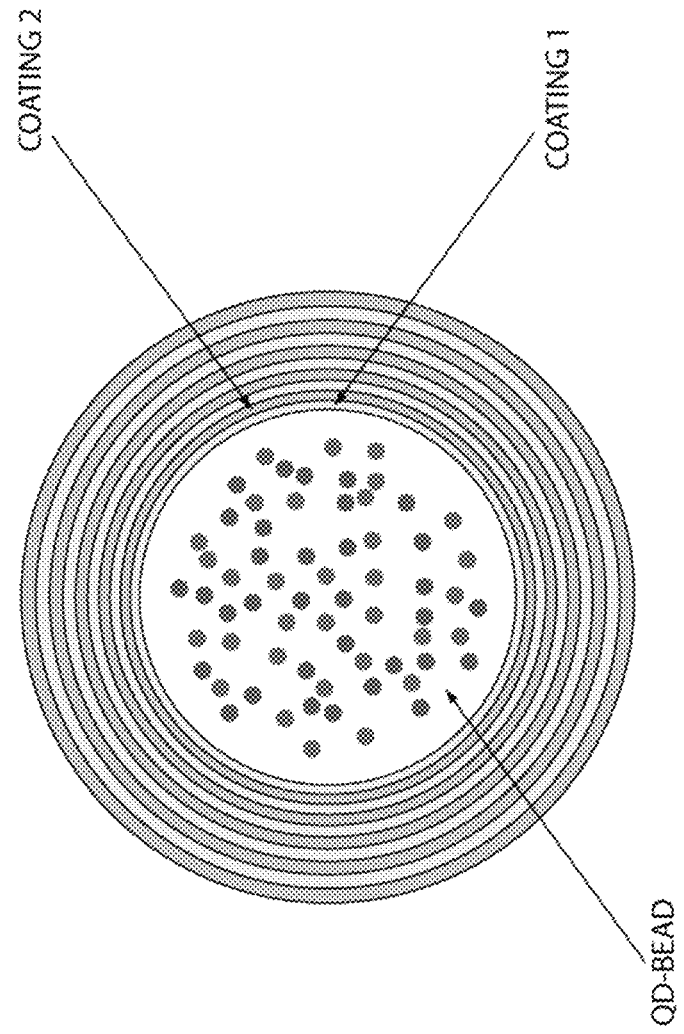
FIG. 6 illustrates a multi-layer coated QD-bead, where the coating comprises alternating layers of two different types of coating material (e.g. inorganic and polymer materials).

The disclosure provides a process for preparing a plurality of coated primary particles, each primary particle having a primary matrix material and containing a population of semiconductor nanoparticles. The process involves providing each primary particle with a surface coating material, which may be a coating of a single material or may be a multi-layered structure of alternating layers of two or more different materials, such as inorganic and polymer layers to form an onion-like structure, as shown in FIG. 6.

Figure 7:
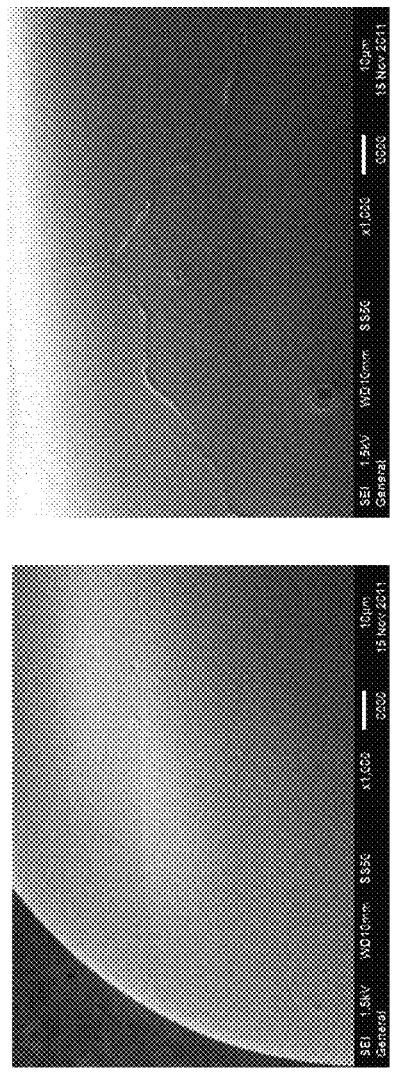
FIG. 7 shows SEM images of an $Al_2O_3$-coated QD-bead from the same batch, following 265 ALD cycles (A) and 500 ALD cycles (B). The thinner surface coating appears smooth and uniform, while substantial cracking and defect formation is observed on the surface of the thicker coated beads.
Figure 8:
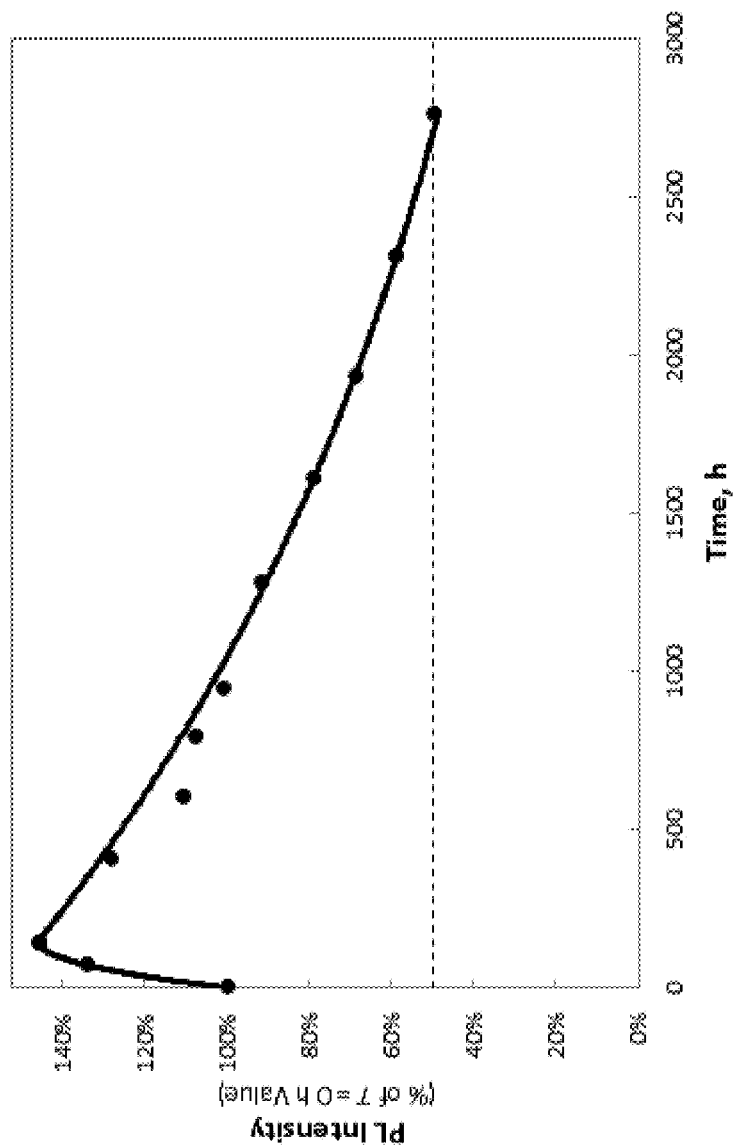
FIG. 8 shows photoluminescence lifetime data for LED devices fabricated from $Al_2O_3$-coated QD-beads following 265 ALD cycles (shown in FIG. 7A), with a PL intensity half-life ($T_{50}$) in the region of 2,500 hours.
Figure 9:
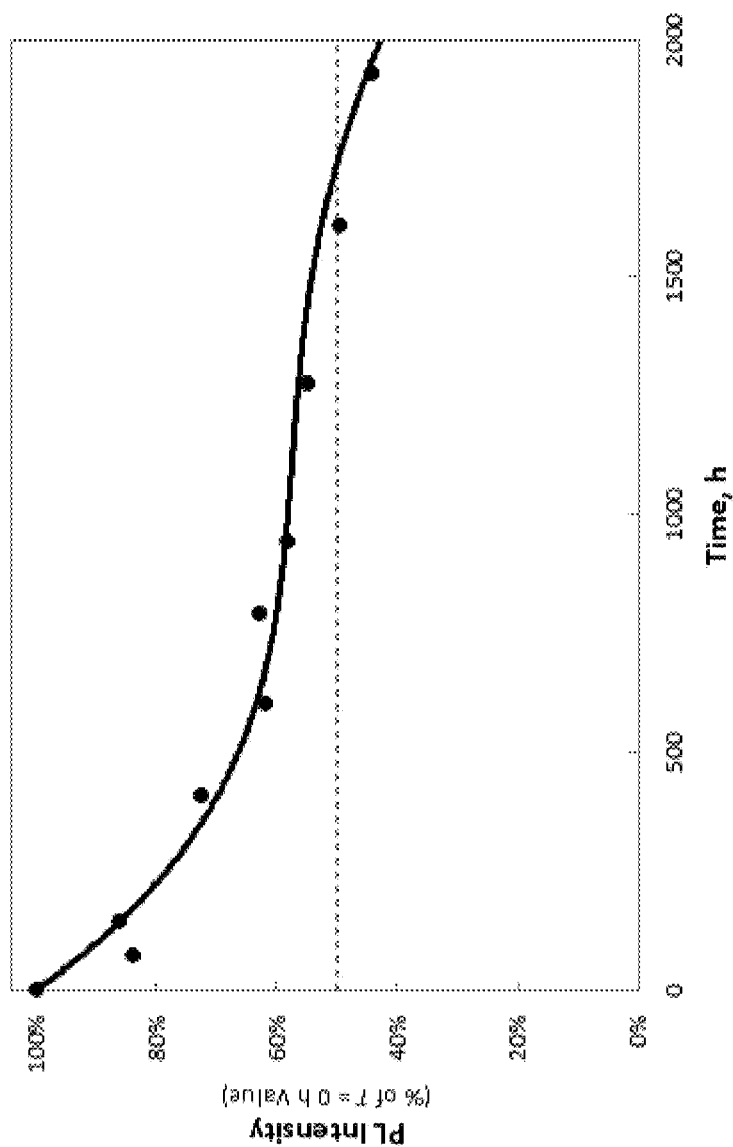
FIG. 9 shows photoluminescence lifetime data for LED devices fabricated from $Al_2O_3$-coated QD-beads following 500 ALD cycles (shown in FIG. 7B), with a PL intensity half-life ($T_{50}$) in the region of 1,500 hours.
Figure 10:
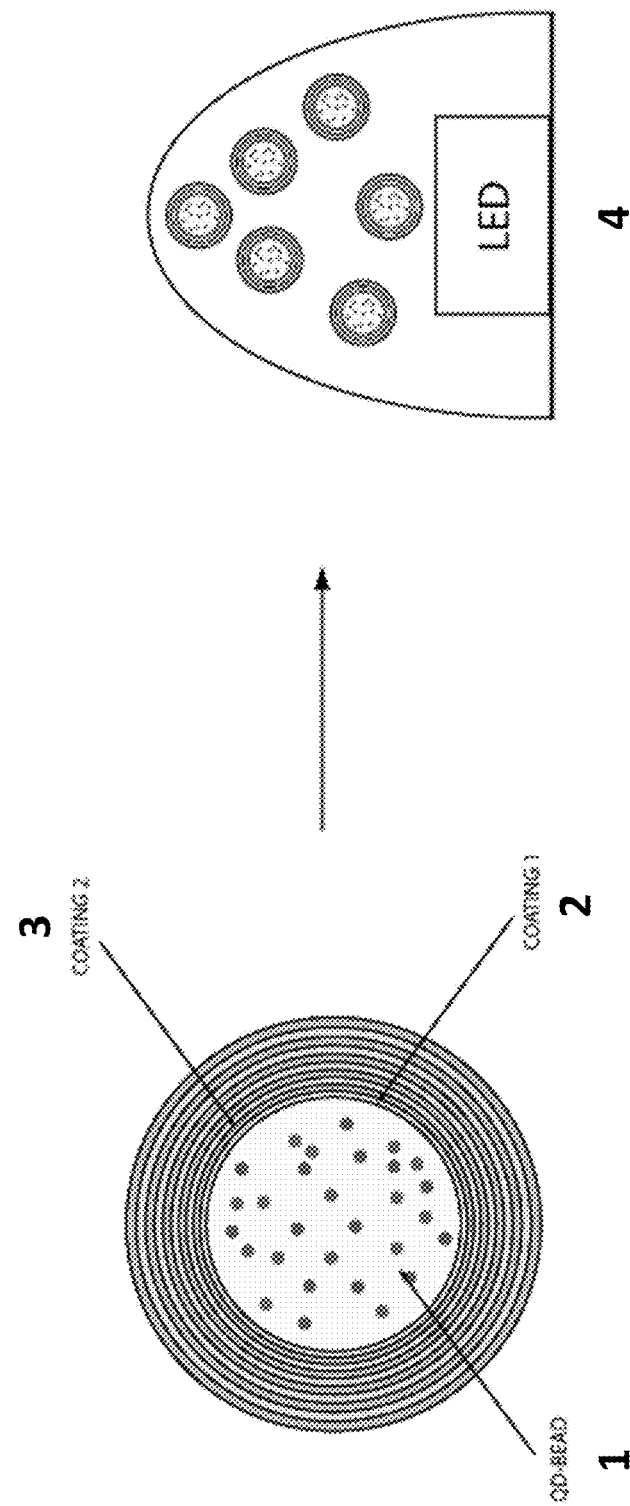
FIG. 10 illustrates a population of quantum dots entrapped within a primary particle in the form of a polymer bead. The primary particle is provided with a multi-layered surface coating comprising alternate layers of, for example, inorganic and polymeric material (coatings 1 and 2, interchangeably), before being dispersed within a secondary matrix material in the form of an LED encapsulant deposited on an LED to provide a light-emitting device.
Figure 11:
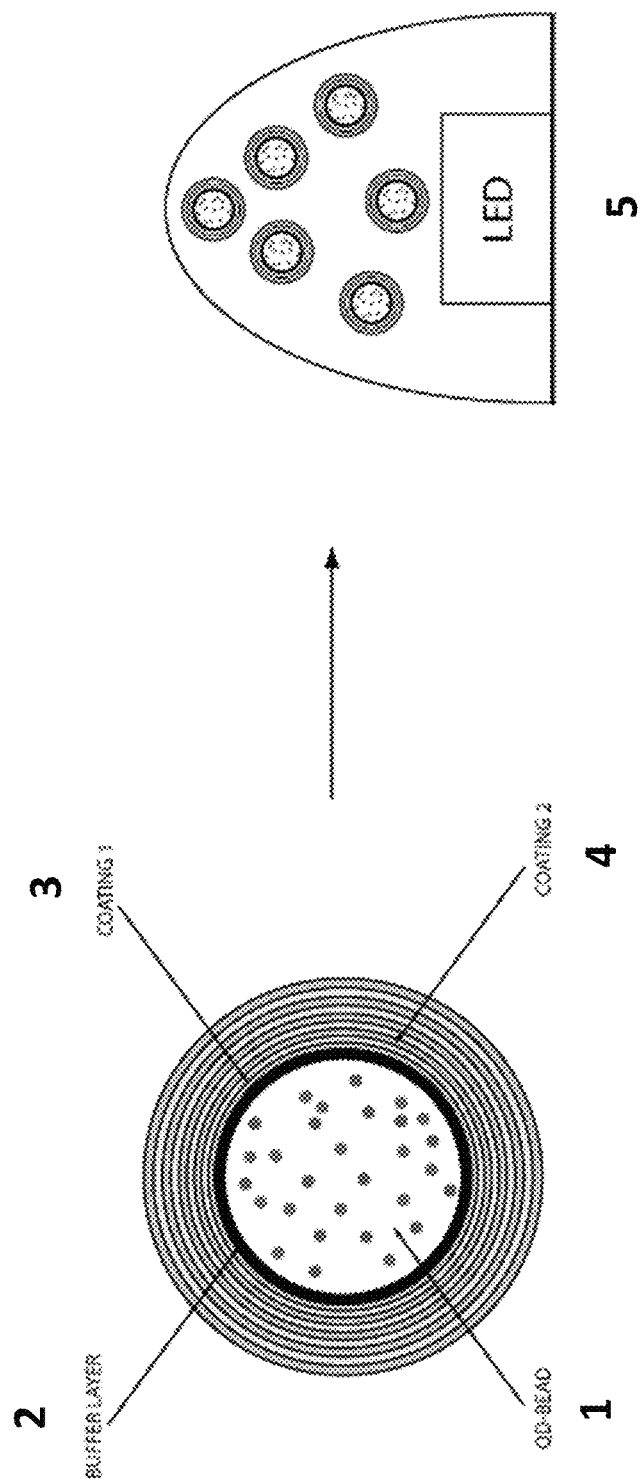
FIG. 11 illustrates quantum dots entrapped within a primary particle in the form of a polymer bead made from a first type of polymer (polymer 1), encapsulated within second type of polymer material (polymer 2) acting as a buffer layer. The surface of the buffer layer is further coated with a multi-layered protective surface coating of alternate layers of, for example, inorganic and polymeric material (coatings 1 and 2, interchangeably). The encapsulated primary particles are then dispersed within a secondary matrix material in the form of an LED encapsulant disposed on an LED to provide a light-emitting device.

The multi-layered coating mitigates cracking and defect formation in the coating, which become more likely for thicker coatings (i.e. with increased number of ALD cycles). This is demonstrated by scanning tunnelling microscopy (SEM) images in FIG. 7. In this example, $Al_2O_3$-coated QD-beads showed a predominantly smooth surface following 265 ALD cycles (FIG. 7A). Marked cracking and defect formation was observed on the coated bead surface following 500 ALD cycles on the same batch of beads (FIG. 7B). The thinner surface coating appears smooth and uniform, while substantial cracking and defect formation is observed on the surface of the thicker coated beads. When incorporated into LED devices, quantum dot beads with the cracked surface coating exhibit poorer performance lifetimes, highlighting the importance of coating homogeneity in providing a bead coating that is impermeable to deleterious species. In this example, LEDs with beads coated using 265 ALD cycles were shown to have a photoluminescence (PL) intensity lifetime (defined as the half-life, $T_{50}$, i.e. the time taken for the PL intensity to fall to 50% of its value at T=0 hours under continuous illumination) in the region of 2,500 hours (FIG. 10). In LEDs incorporating the corresponding beads coated by 500 deposition cycles, with a fractured coating, the $T_{50}$ was reduced to around 1,500 hours (FIG. 11).

To enhance the optical performance lifetimes of QD-bead-containing light-emitting devices, the relatively thin coating that can be applied by ALD without the risk of cracking may not provide the same level of protection from deleterious species and device processing conditions as a thicker homogeneous coating. It is therefore desirable to provide a means to increase the thickness of the coating that can be applied via ALD, while maintaining a crack- and defect-free coating. The multi-layered coating methodology described herein addresses these requirements. By depositing a multi-layered coating, a relatively thick coating can be applied to the QD-bead surface, as determined by the total number of layers, yet each individual layer can be kept relatively thin to minimise cracking and defect formation. Further, using the multi-layer approach, any cracking within a given layer will not propagate through to adjacent layers, maintaining the integrity of the coating as a barrier to oxygen, moisture, and/or free-radicals.

Primary Matrix Material. The primary matrix material is preferably an optically transparent medium, i.e. a medium through which light can pass, and which may be, but does not have to be, substantially optically clear. The primary matrix material, preferably in the form of a bead or microbead, may be a resin, polymer, monolith, glass, sol-gel, epoxy, silicone, (meth)acrylate, or the like.

Examples of primary matrix materials and methods of incorporating quantum dots into beads of primary matrix materials are described in the applicant's co-pending U.S. Patent Application Publication No. 2011/0068322, (filed Sep. 23, 2010, published May 20, 2010). The entire contents of that application are incorporated herein by reference. It should be noted that the methods described herein are not limited to any particular type of primary matrix material.

Primary Particle Surface Coating Materials. The primary particle surface coating provides a protective barrier to prevent the passage or diffusion of potentially deleterious species, e.g. oxygen, moisture and/or free radicals, from the external environment through the primary matrix material to the semiconductor nanoparticles. As a result, the semiconductor nanoparticles are less sensitive to their surrounding environment and the various processing conditions typically required to utilise the nanoparticles in applications such as the fabrication of LED-based light-emitting devices.

The coating is preferably a barrier to the passage of oxygen or any type of oxidising agent through the primary matrix material. The coating may be a barrier to the passage of free radical species through the primary matrix material, and/or is preferably a moisture barrier so that moisture in the environment surrounding the primary particles cannot contact the semiconductor nanoparticles within the primary particles.

The coating may include one or more layers of coating material on a surface of the primary particle of any desirable thickness, provided it affords the required level of protection. Each surface layer coating is typically about 1 to 10 nm thick, up to around 400 to 500 nm thick, or more. In some embodiments, layer thicknesses are in the range of about 1 to 200 nm, for example between 5 to 100 nm.

In some embodiments, the coating includes a layered structure composed of alternate layers of one or more barrier layer and spacer layer. The term "barrier layer" is herein used to describe a layer or layers that are the primary means of preventing oxygen and moisture penetration to the underlying bead. A barrier layer is typically composed of an inorganic material. The term "spacer layer" is herein used to describe a layer or layers between the barrier layers. A spacer layer is used to separate adjacent barrier layers. A spacer layer may allow some flexibility and may or may not have some inherent barrier properties. A spacer layer may, for example, be an organic polymer, or a hybrid inorganic-organic polymer material. The coating can include between 1 and 20 layers, for example between 3 and 10 layers. The term "layer" is herein used to describe the coating of a single type of material, but may incorporate multiple depositions of a single type of coating material; for instance a single inorganic layer may be deposited by several hundred ALD cycles, yet each deposition cycle is not herein considered to form a separate layer. According to some embodiments, the total coating thickness of any multi-layered coating may fall below 10 µm, and is typically between 25 nm and 1 µm. In some embodiments, the thickness of the barrier layer(s) is different to that of the spacer layer(s). For example, a barrier layer thickness may range from 10 nm to 100 nm and a spacer layer thickness may range from 10 nm to 10 µm.

The inorganic (barrier) material(s) may be a dielectric (insulator), a metal oxide (including a transparent conducting oxide), a metal nitride or a silica-based material (e.g. a glass). When a metal oxide is used the metal oxide may be a single metal oxide (i.e. oxide ions combined with a single type of metal ion, e.g. $Al_2O$), or may be a mixed metal oxide (i.e. oxide ions combined with two or more types of metal ion, e.g. $SrTiO_3$ or a doped metal oxide such as doped transparent conducting oxide (TCO), e.g. Al-doped ZnO, Ga-doped ZnO, etc.). The metal ion(s) of the (mixed) metal oxide may be selected from any suitable group of the periodic table, such as group 2, 13, 14 or 15, or may be a d-block metal, or lanthanide metal. Particular metal oxides include, but are not restricted to: $Al_2O_3$, ZnO, $HfO_2$, $SiO_2$, $ZrO_2$, and $TiO_2$, and including combinations, alloys and/or doped species thereof; and/or TCOs, e.g. Al-doped ZnO, Ga-doped ZnO, and $In_2O_3$. The inorganic coating(s) may include silica in any appropriate form. In some embodiments, one or more inorganic barrier layer materials is a metal oxide chosen from the group $Al_2O_3$, ZnO, $TiO_2$, $In_2O_3$, or combinations and/or doped species thereof. In particular embodiments, the metal oxide is a TCO e.g. Al-doped ZnO, Ga-doped ZnO, etc. In addition to offering gas-barrier properties, TCOs may be of particular advantage as QD-bead coating materials by potentially increasing the amount of light that is able to penetrate the QD-bead coating, relative to non-transparent coating materials, thus enhancing the quantum efficiency (QE) of the QD-bead package to improve the efficiency of light-emitting devices thereof. Another advantage of a TCO material may include the reduction in charging of the beads due to the conductive surface.

The spacer layer coating may incorporate an inorganic material in combination with an organic or polymeric material. By way of example, the coating can be an inorganic-polymer hybrid, such as an aluminium alkoxide polymer (alucone), or a silica-acrylate hybrid material. The polymeric coating material may include a saturated or unsaturated hydrocarbon polymer, or may incorporate one or more heteroatoms (e.g. O, S, N, halo) or heteroatom-containing functional groups (e.g. carbonyl, cyano, ether, epoxide, amide, and the like). Examples of polymeric coating materials are described in the applicant's co-pending U.S. Patent Application Pub. No. 2011/0068322.

In some embodiments, the spacer coating material includes a hydrophilic surface to improve compatibility between the QD-beads and the aforementioned inorganic coating material(s). In some embodiments, the spacer layer may be applied to the bead surface before any barrier layers to act as a buffer layer between the bead and the barrier coating. Suitable examples include hydrophilic polymers, moderately polar and/or amphiphilic polymers, including —OH-terminated polymers. Suitable non-limiting examples include poly (vinyl alcohols) (e.g. Mowiol®), ethylene vinyl alcohols (e.g. poly(vinyl alcohol-co-ethylene), (meth)acrylates (e.g. poly(hydroxyethylmethacrylate), poloxamers (e.g. Pluronic®, Kolliphor®), poly(vinylpyrrolidone), poly (ethers) (e.g. glycerol poly(oxalate), poly(methylvinylether), poly(epoxysuccinic acid), poly(ethylene glycol) etc.), poly(thioethers) (e.g. poly(thiophene), poly(3,4-ethylenedioxythiophene), etc.), poly(thiols), poly(vinyl acids) (e.g. (poly(vinyl acetate), poly(vinylphosphonic acid), poly(vinyl sulphate), etc.), poly(amides) (e.g. poly(acrylamide), poly (ethyloxazoline), poly(esters), and fumed silica. Suitable polymer coating materials include poly (vinyl alcohols), ethylene vinyl alcohols, poly(hydroxyethylmethacrylates), Pluronics®, poly(vinylpyrrolidone), poly(ethylene glycol) and fumed silica.

By incorporating quantum dots into primary particle materials of the kind described above and barrier coating the particles it is possible to protect the otherwise reactive quantum dots from the potentially damaging surrounding chemical environment. Moreover, by placing a number of quantum dots into a single bead, for example in the size range from 20 nm to 500 µm in diameter, and providing the bead with a suitable protective coating of, for example, alternate layers of inorganic and/or polymer material, the resulting coated QD-bead is more stable than either free "naked" quantum dots, uncoated QD-beads, or QD-beads coated with a single coating material (e.g. a polymeric, inorganic or inorganic-organic hybrid material) to the types of chemical, mechanical, thermal and/or photo-processing steps which are required to incorporate quantum dots in most commercial applications, such as when employing quantum dots as down-converters in a "QD-solid-state-LED" light-emitting device.

Each primary particle may contain any number and/or type of semiconductor nanoparticles. For example, the primary particle may contain a single type of semiconductor nanoparticle, e.g. InP, InP/ZnS or CdSe, of a specific size range, such that the plurality of coated QD-containing beads emits monochromatic light of a pre-defined wavelength, i.e. colour. The colour of the emitted light may be adjusted by varying the type of semiconductor nanoparticle material used, e.g. by changing the size of the nanoparticle, the nanoparticle core semiconductor material and/or adding one or more outer shells of different semiconductor materials. Alternatively, colour control can also be achieved by incorporating different types of semiconductor nanoparticles, for example, nanoparticles of different size and/or chemical composition within the primary matrix material of each primary particle.

Using an appropriate number of QDs within each particle can control the colour and colour intensity of the QD-containing beads. For example, each primary particle can contain at least around 1,000 QDs of one or more different types, or at least around 10,000, or at least around 50,000, or at least around 100,000 QDs of one or more different types.

Primary particles in the form of beads or microbeads can contain one or more semiconductor nanoparticles capable of secondary light emission upon excitation by primary light emitted by a primary light source (e.g. an LED). The quantum dot-containing primary particles can be coated and then dispersed in a secondary matrix material, which may be the same or different to the primary matrix material. Thus, the disclosure also provides a composite material incorporating a plurality of coated primary particles dispersed within a secondary matrix material.

A still further aspect provides a light-emitting device including a primary light source in optical communication with a formulation, comprising a composite material according to the above further aspect, embedded in a secondary matrix material (i.e., a host light-emitting diode encapsulation medium). The secondary matrix material may be selected from the group of primary matrix materials set out above. By way of example, said secondary matrix material may include a material selected from the group consisting of, but is not restricted to, a polymer, a resin, a monolith, a glass, a sol-gel, an epoxy, a silicone and a (meth)acrylate. Additionally, the secondary matrix material may be formed into one or more secondary particles containing one or more primary particles. The secondary particles may be provided with a surface coating in a similar manner to that described above in respect of the primary particles. Accordingly, the secondary matrix material may be in the form of one or more secondary particles, whereby a surface of the, or each, secondary particle is provided with a separate layer of a further surface coating material. The further surface coating material comprises a material selected to provide the, or each, secondary particle with a protective barrier to prevent the passage or diffusion of potentially deleterious species from the external environment through the secondary matrix material to the primary matrix material.

Alternatively, the quantum dots may first be disposed within a matrix material, such as a polymeric bead, and then each of those beads may be contained within a primary matrix material to form the primary particles, which are then provided with a surface coating. Thus, the semiconductor nanoparticles contained within the primary matrix material may be "naked" nanoparticles, or may be disposed within a matrix material, which is itself disposed within the primary matrix material and coated.

The plurality of coated primary particles may be dispersed within an encapsulating medium, such as, but not restricted to, an LED encapsulant, to provide a robust QD-containing formulation which can then be used in subsequent processing steps, for example, to deposit a desired amount of such a formulation onto an LED chip to provide a QD-LED-based light-emitting device. Any desirable number of beads may be dispersed or embedded within the encapsulating medium. For example, the formulation may contain 1 to $10^{13}$ beads, 1 to 10,000 beads, or 1 to 1,000 beads. According to one embodiment an LED having a 3 mm$^3$ LED well, was packed with 50% beads by volume. The beads were 100 microns in diameter, yielding approximately 3,000 beads in the well. Reducing the bead size to 20 microns in diameter would yield approximately $4 \times 10^5$ in the same sized well.

It should also be appreciated that the encapsulating medium may have embedded therein one or more types of coated semiconductor nanoparticle-containing primary particles. That is, two or more different types of primary particles (one or more containing the nanoparticles) may be embedded within the same encapsulating medium. In this way, where the population of nanoparticles contains more than one different type of nanoparticle, the nature of the primary particle can be selected for optimum compatibility with both the different types of nanoparticles and the particular medium used.

Advantages of coated quantum dot-containing beads over free quantum dots or uncoated quantum dot-containing beads can include greater stability to air and moisture, greater stability to photo-oxidation and/or greater stability to mechanical processing. Moreover, by pre-loading small microbeads, which can range in size from a few 50 nm to 500 µm, with quantum dots and individually coating the microbeads prior to incorporating a plurality of such quantum dot-containing beads into an LED encapsulation material on a UV or blue LED, it is a relatively simple process to change, in a controllable and reproducible manner, the colour of the light emitted by the resulting LED-based light-emitting device.

Semiconductor Nanoparticles. Any type of semiconductor nanoparticle (i.e., QDs) may be employed as described herein. For example, the nanoparticles may contain ions selected from any group of the periodic table, such as but not limited to group 11, 12, 13, 14, 15 or 16 of the periodic table. The nanoparticles may incorporate d-block metal ions. The nanoparticles can contain first and second ions and/or optionally third and/or fourth ions, with the first ion preferably selected from group 11, 12, 13 or 14 and the second ion preferably selected from group 14, 15 or 16 of the periodic table. The nanoparticles can contain group 12 and 16 ions (II-VI semiconductor material), group 13 and 15 ions (III-V semiconductor material), group 14 and 16 ions (IV-VI semiconductor material) and/or group 12, 13 and 16 ions (I-III-VI semiconductor material). The nanoparticles may contain one or more semiconductor materials selected from the group consisting of CdO, CdS, CdSe, CdTe, ZnO, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe, AgInS$_2$, CuInS$_2$, CuInSe$_2$, and combinations thereof. Moreover, the nanoparticles may be binary, tertiary, quaternary or higher order multinary core, core/shell or core/multishell, doped or graded nanoparticles. According to some embodiments, the QD nanoparticles are essentially free of cadmium and/or other heavy metals.

Any method may be employed to produce the semiconductor nanoparticles employed in the various aspects of the present invention. According to an exemplary method, semiconductor nanoparticles are produced by converting a nanoparticle precursor composition to the material of the nanoparticles in the presence of a molecular cluster compound under conditions permitting seeding and growth of the nanoparticles on the cluster compound. The method may employ the methodology set out in the Applicant's U.S. Pat. No. 7,803,423, filed Apr. 27, 2005 and/or U.S. Pat. No. 7,588,828, filed Sep. 10, 2007. The entire contents of each of those patents are incorporated herein by reference. The nanoparticles can incorporate first and second ions and the nanoparticle precursor composition can comprise first and second nanoparticle precursor species containing the first and second ions respectively which are combined, preferably in the presence of a molecular cluster compound. The first and second precursor species may be separate species in the precursor composition, or may form part of a single molecular species containing both the first and second ions.

In embodiments employing a molecular cluster compound, the molecular clusters may contain third and fourth ions. At least one of the third and fourth ions may be different than the first and second ions contained in the first and second nanoparticle precursor species, respectively. The third and fourth ions may be selected from any desirable group of the periodic table, such as, but not limited to, group 11, 12, 13, 14, 15 or 16 of the periodic table. The third and/or fourth ion may be a d-block metal ion. In some embodiments, the third ion is selected from group 11, 12, 13 or 14 and the fourth ion is selected from group 14, 15 or 16 of the periodic table.

By way of example, the molecular cluster compound may incorporate third and fourth ions from groups 12 and 16 of the periodic table, respectively, and the first and second ions derived from the first and second nanoparticle precursor species may be from groups 13 and 15 of the periodic table, respectively. Example processes for preparing semiconductor nanoparticles using molecular clusters are described in the Applicant's co-pending patent applications and granted patents, for example U.S. Pat. Nos. 7,588,828 and 7,867,556.

The coordination about the final inorganic surface atoms in any core, core/shell or core/multishell, doped or graded nanoparticle is typically incomplete, with highly reactive non-fully coordinated atoms acting as "dangling bonds" on the surface of the particle, which can lead to particle agglomeration. This problem is typically overcome by passivating (capping) the "bare" surface atoms with protecting organic groups ("capping agents").

In many cases, the capping agent is the solvent in which the nanoparticles have been prepared, and consists of a Lewis base compound, or a Lewis base compound diluted in an inert solvent such as a hydrocarbon. There is a lone pair of electrons on the Lewis base capping agent that is capable of a donor type coordination to the surface of the nanoparticle; ligands of this kind include, but are not limited to, mono- or multi-dentate ligands such as phosphines (trioctylphosphine, triphenylphosphine, t-butylphosphine, etc.), phosphine oxides (trioctylphosphine oxide, triphenylphosphine oxide, etc.), alkyl phosphonic acids, alkyl-amines (hexadecylamine, octylamine, etc.), aryl-amines, pyridines, long chain fatty acids and thiophenes.

In addition to the outermost layer of organic material or sheath material (capping agent) helping to inhibit nanoparticle-nanoparticle aggregation, this layer can also protect the nanoparticles from their surrounding electronic and chemical environments, and can provide a means of chemical linkage to other inorganic, biological and/or organic material, whereby the functional group is pointing away from the nanoparticle surface and is available to bond/react/interact with other available molecules. Examples include, but are not limited to, amines, alcohols, carboxylic acids, esters, acid chlorides, anhydrides, ethers, alkyl halides, amides, alkenes, alkanes, alkynes, allenes, amino acids, azides, etc. The outermost layer (capping agent) of a quantum dot can also consist of a coordinated ligand that possesses a functional group that is polymerisable and can be used to form a polymer layer around the nanoparticle. The outermost layer can also consist of organic units that are directly bonded to the outermost inorganic layer, such as via a disulphide bond between the inorganic surface (e.g. ZnS) and a thiol capping molecule. Such organic units can also possess additional functional group(s), not bonded to the surface of the particle, which can be used to form a polymer around the particle, or for further reaction/interaction/chemical linkage.

An example of a material to which nanoparticle surface-binding ligands can be linked is the primary matrix material from which the primary particles are formed. There are a number of approaches to incorporate semiconductor nanoparticles, such as quantum dots, into the types of primary matrix materials described hereinbefore by pre-coating the nanoparticles with ligands that are compatible in some way with the matrix material of the primary particles. By way of example, in the embodiment where the semiconductor nanoparticles are to be incorporated into polymeric beads, the nanoparticles can be produced so as to possess surface ligands that are polymerisable, hydrophobic, hydrophilic, positively or negatively charged, or functionalised with a reactive group capable of associating with the polymer of the polymeric beads, by chemical reaction, covalent linkage or non-covalent interaction (e.g. interchelation).

The inventors have determined that it is possible to take quantum dots prepared using any desirable method, incorporate these quantum dots into silica or polymer beads, and then to coat the beads with a protective multi-layer barrier of alternate layers of inorganic and/or polymer materials, such as aluminium oxide and an aluminium alkoxide polymer (alucone), respectively, to provide significantly more robust, easily processable quantum dot-containing materials, with enhanced stability of their optical properties to chemical and/or thermal processing environments compared to the uncoated beads. The multi-layered architecture ensures that defects and/or cracks are confined to their layer of origin to maintain the integrity of the coating as a gas and/or moisture barrier, increasing the longevity of subsequent quantum dot-containing devices. Coated quantum dot-containing beads of this kind can be employed in a wide range of applications, particularly, but not exclusively, the fabrication of LED-based light-emitting devices wherein the coated QD-beads are embedded within a host LED encapsulant and then deposited onto a solid-state LED chip to form a quantum dot-based light-emitting device.

The application of a surface coating to QD-containing beads can lead to deterioration of their optical performance and/or stability. Above a certain thickness (influenced by both the inherent properties of the coating material, the bead diameter, and ALD processing conditions), inorganic coating materials have a tendency to crack as shown for $Al_2O_3$-coated bead in FIG. 7B, compromising the integrity of the coating material as a barrier to deleterious species such as oxygen and/or moisture, and thus leading to deterioration of the optical performance lifetime of coated QD-bead-containing devices. Yet, a relatively thick coating may be desirable to maximise its impermeability to water, oxygen and other deleterious species, and/or its level of protection to the QD-containing beads from subsequent harsh physical and/or chemical processing conditions. The problem is circumvented in the current invention by applying a surface coating via the deposition of alternate layers of barrier and spacer coating materials; here, each individual layer is relatively thin, reducing the probability of crack formation, while the total coating is sufficiently thick to adequately function as a gas-barrier. In the event of defect or crack formation within a layer, by alternately depositing layers of barrier and spacer materials the crack is unlikely to propagate to adjacent layers. Thus, even in the presence of cracks, the convoluted diffusion pathway for attack upon the primary particles by small molecules of deleterious species renders the process unlikely.

Incorporating Quantum Dots into Beads. Considering the initial step of incorporating quantum dots into beads, a first option is to incorporate the quantum dots directly into the beads. A second option is to immobilise the quantum dots in beads through physical entrapment. It is possible, using these methods, to make a population of beads that contain just a single type of quantum dot (e.g. one colour) by incorporating a single type of quantum dot into the beads. Alternatively, it is possible to construct beads that contain 2 or more types of quantum dot (e.g. two or more colours) by incorporating a mixture of two or more types of quantum dot (e.g. material and/or particle size) into the beads. Such mixed beads can then be combined in any suitable ratio to emit any desirable colour of secondary light following excitation by the primary light emitted by the primary light source (e.g. LED).

Methods to incorporate quantum dots into beads are described in the applicant's co-pending U.S. Patent Application Pub. Nos. 2011/0068321 and 2011/0241229. The subsequent formation of QD-bead light-emitting devices is described in co-pending U.S. Patent Application Pub. Nos. 2010/0123155 and 2011/0068322 (filed Sep. 23, 2010, the contents of which are incorporated herein by reference).

With regard to the first option of incorporating the quantum dots directly into the primary particles (i.e. the beads) during bead formation, by way of non-limiting example, suitable core, core/shell or core/multishell nanoparticles (e.g. InP/ZnS core/shell quantum dots) may be contacted by one or more bead precursors (e.g. an acrylate monomer, a silicate material, or a combination of both) and then subjected to suitable conditions (e.g. introduction of a polymerisation initiator) to form the bead material. The strategy results in statistically random incorporation of the quantum dots into the beads and thus the polymerisation reaction will result in beads containing statistically similar amounts of quantum dots. Bead size can be controlled by the choice of polymerisation reaction used to construct the beads, and additionally, once a polymerisation method has been selected, bead size can also be controlled by selecting appropriate reaction conditions, e.g. in a suspension polymerisation reaction, by stirring the reaction mixture more quickly to generate smaller beads. Moreover, the shape of the beads can be readily controlled by the choice of procedure in conjunction with whether or not the reaction is carried out in a mould. Changing the composition of the monomer mixture from which the beads are constructed can alter the bead composition. Similarly the beads can also be cross-linked with varying amounts of one or more cross-linking agents (e.g. divinyl benzene). If beads are constructed with a high degree of cross-linking, e.g. greater than 5 mol. % cross-linker, it may be desirable to incorporate a porogen (e.g. toluene or cyclohexane) during the bead-forming reaction. The use of a porogen in such a way leaves permanent pores within the matrix constituting each bead. These pores may be sufficiently large to allow the ingress of quantum dots into the bead.

In respect of the second option for incorporating quantum dots into the primary particles, the quantum dots can be immobilised within the primary matrix material via physical entrapment. For example, a solution of quantum dots in a suitable solvent (e.g. an organic solvent) can be incubated with a sample of primary particles. Removal of the solvent, using any appropriate method, results in the quantum dots becoming immobilised within the primary matrix material of the primary particles. The quantum dots remain immobilised in the primary particles unless the sample is resuspended in a solvent (e.g. organic solvent) in which the quantum dots are freely soluble. At this stage, the surface coating can be applied to the beads. As with quantum dot incorporation into primary particles during the particle forming reaction (i.e. the first option described above) the prefabricated primary particles can be of any shape, size and composition, may have any degree of cross-linker, and may contain permanent pores if constructed in the presence of a porogen. Quantum dots may be imbibed into the primary particles by incubating a solution of quantum dots in an organic solvent, then adding this quantum dot solution to the primary particles. The solvent must be capable of wetting the primary particles, and in the case of lightly cross-linked primary particles, preferably 0-10% cross-linked and most preferably 0-2% cross-linked, the solvent should cause the polymer matrix to swell in addition to solvating the quantum dots. Once the quantum dot solution has been incubated with the primary particles, the solvent can be removed, for example by heating the mixture and causing the solvent to evaporate and the quantum dots to become embedded in the primary matrix material constituting the primary particles, or alternatively, by the addition of a second solvent in which the quantum dots are not readily soluble but which mixes with the first solvent causing the quantum dots to precipitate within the primary matrix material. Immobilisation may be reversible if the primary particles are not chemically reactive, however if the primary particles are chemically reactive, the quantum dots may be held permanently within the primary matrix material, by a chemical, covalent, ionic, or any other form of interaction. Both methodologies are described in detail in the aforementioned co-pending US patent applications.

Incorporation of Quantum Dots into Sol-Gels to Produce Glass. As stated above, a suitable primary matrix material is an optically transparent medium, such as a sol-gel or a glass. Such primary matrix materials may be formed in an analogous fashion to the method used to incorporate quantum dots into primary particles during the particle forming process as described above. For example, a single type of quantum dot (e.g. one colour) may be added to a reaction mixture used to produce a sol-gel or glass. Alternatively, two or more types of quantum dot (e.g. two or more colours) may be added to a reaction mixture used to produce a sol-gel or glass. The sol-gels and glasses produced by these procedures may have any shape, morphology or 3-dimensional structure. For example, the resulting primary particles may be spherical, disc-like, rod-like, ovoid, cubic, rectangular, or any of many other possible configurations.

Application of a Buffer Layer. In the case of ALD-coated QD-containing beads, the bead surface may not be compatible with the chosen inorganic barrier and/or spacer coating materials. For instance, the application of $Al_2O_3$ to the surface of QD-polymer beads by ALD can result in damage to the beads due to the processing conditions, deteriorating their optical properties, and with poor adhesion of the inorganic barrier coating to the bead surface. In the case of acrylate-based beads, highly polar polymeric coatings, e.g. polyethylene glycol (PEG), adhere poorly to the bead surface. To overcome these problems, in one embodiment, prior to the deposition of the QD-bead coating, the primary particles are encapsulated in a second polymer to form secondary particles. Here, a thin layer of the second polymer material is deposited on the surface of the primary particles to act as a buffer layer to improve adhesion between the primary particles and a first inorganic or polymer coating material, while protecting the primary particles from possible deleterious effects of the coating process. The coating may be applied by any technique known to those skilled in the art, and can include any of the methods that have previously described to form the primary particles (beads), e.g. solution or suspension polymerisation, or those methods used to deposit the multilayer coating materials hereafter, such as ALD, though not restricted to these. Non-limiting examples are detailed in the applicant's co-pending U.S. Patent application Pub. No. 2011/0068321. The buffer layer can provide a hydrophilic surface, for example, having —OH terminated groups, and may be a polymer or cross-linker, with suitable examples including, but not restricted to poly (ethers), poly(thioethers), poly(thiols), poly(carbonyls), poly(esters), poly(amides). By way of non-limiting example, a trimethylolpropane trimethacrylate (TMPTMA) cross-linker buffer layer may be applied to the surface of QD-poly(lauryl methacrylate) beads via suspension polymerisation in poly(vinyl acetate) (PVA)/water solution prior to the deposition of an $Al_2O_3$ coating by ALD, to both protect the QD-beads and improve the adhesion of the alumina to the bead surface.

Application of Surface Coating. A process to deposit at least one of the surface coating materials is ALD, although it will be appreciated that other suitable techniques can be employed. The provision of a surface coating by ALD, using a metal oxide surface coating as an example, features the following four basic steps:

1) Exposing a surface of a quantum dot-containing primary particle to a metal precursor;
2) Purging the reaction chamber containing the primary particles to remove non-reacted metal precursor and any gaseous reaction by-products;
3) Exposing the surface of the primary particles to an oxide precursor, and
4) Purging the reaction chamber to remove non-reacted oxide precursor and any gaseous reaction by-products.

The above steps can then be repeated any desirable number of times to provide a surface coating of the desired thickness, for example, a thickness of around 1 to 500 nm. Each reaction cycle adds a predetermined amount of coating material to the surface of the primary particles. One cycle may take time around 2-5 minutes and deposit between 0.6-3 Å of surface coating.

For the coating of 3D particles such as QD-beads, fluidising beds may be used to agitate the particles, to achieve a uniform coating over the entire surface of all particles within a batch. Many fluidising methods are described in the prior art. In some embodiments, the fluidising of QD-beads is achieved using a sintered frit to support the beads, with agitation of the beads being induced by either a continuous flow or pulses of an inert carrier gas such as $N_2$ or Ar. However, the agitation need not be created by an inert gas. For example, one skilled in the art will recognise that sufficient flow of the precursor gas could create the agitation.

The above ALD steps can be carried out under either "half-pulsing" or "full-pulsing" conditions. Herein, the term "half-pulsing" should be understood to refer to pulsing with an inert gas during exposure to at least one, but not all, of the precursor gases. In the case where the process incorporates two precursor exposure steps, half-pulsing refers to pulsing during one of the precursor exposure steps. Herein, the term "full-pulsing" should be understood to refer to pulsing with an inert gas during exposure to all of the precursor gases. In some embodiments, under half-pulsing conditions, the QD-containing beads are agitated by a gas pulse during exposure to the metal precursor (Step 1). In alternative embodiments, under half-pulsing conditions, the QD-beads are agitated by a gas pulse during exposure to the oxide precursor (Step 3). In the example above, under full-pulsing conditions the QD-containing beads are agitated by an inert gas pulse during exposure to both the metal and oxide precursors (Steps 1 and 3). The ALD steps can also be carried out under partial-pulsing conditions, whereby the QD-containing beads are agitated by pulsed gas during a portion of either the metal and/or the oxide exposures. Herein, the term "partial-pulsing" should be understood to refer to pulsing with an inert gas during a portion of the duration of one or more of the precursor exposure steps.

The application of an inorganic-organic hybrid polymer spacer coating via ALD, making an aluminium alkoxide polymer as an example, includes the following 4 basic steps:

1) Exposing a surface of a quantum dot-containing primary particle to a metal precursor;
2) Purging the reaction chamber containing the primary particles to remove non-reacted metal precursor and any gaseous reaction by-products;
3) Exposing the surface of the primary particles to an organic polymer precursor (monomer); and
4) Purging the reaction chamber to remove non-reacted monomer and any gaseous reaction by-products.

The above steps can then be repeated any desirable number of times to provide a surface coating of the desired thickness, for example, a thickness of around 1 to 500 nm. Each reaction cycle adds a predetermined amount of coating material to the surface of the primary particles. According to one embodiment, a cycle may take time around 2-5 minutes and deposit between 0.6-10 Å of surface coating. These steps can be carried out under either half-pulsing, full-pulsing or partial-pulsing conditions, as described above.

In certain embodiments, the QD-bead coating comprises multiple, alternate layers of one or more types of barrier and one or more types of spacer material. In the deposition of alternate layers of barrier and spacer coatings, in one embodiment the first coating layer deposited onto the surface of the QD-containing primary particles, optionally pre-coated with a buffer layer, is that of the spacer material. By applying a spacer layer directly to the surface of the primary particles (or buffer layer), potential problems relating to the adhesion of a barrier material to the primary particle (or buffer layer, where applicable) surface may be avoided.

In another embodiment, the first coating layer deposited onto the surface of the QD-containing primary particles, optionally pre-coated with a buffer layer, is that of the barrier material. The application of a barrier layer directly to the surface of the primary particles may result in less damage that the QD-bead surface than the direct application of a spacer coating material to the bead surface.

In certain embodiments, the multi-layered coating, comprising alternating layers of barrier and spacer coatings, is terminated with an inorganic layer. The inorganic-terminated surface coating is substantially stable to atmospheric moisture, potentially facilitating the storage and/or handling of QD-containing coated beads in ambient conditions.

In alternative embodiments, the multi-layered coating, having alternate layers of barrier and spacer coatings, is terminated with a polymer layer. The polymer-terminated surface coating may provide chemical functionality to render the QD-containing coated beads compatible with organic solvents and/or LED encapsulation media, facilitating their incorporation into light-emitting devices. In further embodiments, the multi-layered coating may include alternate layers of two or more inorganic barrier coatings, forming an all-inorganic multi-layered gas-barrier coating.

ALD can be combined with other deposition techniques to form a multi-layered coating. By way of non-limiting example, a multi-layered coating having alternate layers of inorganic barrier and organic spacer material can be formed using ALD to deposit the inorganic barrier layers and solution polymerisation to deposit the organic polymer spacer layers. Layer deposition can continue until a desired coating thickness is achieved, terminating with either an inorganic barrier or polymer spacer outer coating layer. The outer layer composition may be chosen to afford compatibility with a particular processing medium or application. By way of non-limiting example, a polymer-terminated outer spacer coating layer may be desired to provide compatibility of the QD-containing coated beads with an LED encapsulation medium.

In certain embodiments, a different coating material to those incorporated into the multi-layered coating may be applied as the terminating, outer coating layer, to afford specific properties to the coated QD-beads and/or compatibility with a specific processing medium or application. Examples of terminating, outer coating layer materials include, but are not restricted to, ZnO, $ZrO_2$ or $SiO_2$.

A particular inorganic surface coating is $Al_2O_3$. An $Al_2O_3$ surface coating of only up to around 20 to 30 nm, applied by ALD at a temperature of around 50 to 120° C., more specifically 70 to 90° C., using trimethylaluminium and water as precursors, exhibits a very low water vapour transmission rate and low permeability to other gases and liquids. This process is demonstrated in Examples 1 and 2. In an alternative embodiment, ozone may be used in the place of water as the oxide precursor in the deposition or an inorganic metal oxide material such as $Al_2O_3$.

A particular hybrid inorganic-organic polymer surface coating is aluminium alkoxide alloy polymer. An aluminium alkoxide alloy polymer surface coating of up to around 5 to 100 nm, applied by ALD at a temperature of around 50 to 120° C., more specifically 70 to 90° C., using TMA, ethylene glycol (EG) and water as precursors, can be used to prevent the propagation of defects in adjacent inorganic layers through the entire thickness of the gas-barrier coating, to improve the thermal stability of the QD-containing beads, and/or improve the compatibility of any metal oxide coating(s) with the QD-bead material and/or subsequent processing media such as, but not restricted to, LED encapsulants. An example of this type of process is demonstrated in Example 4.

The deposition of a multi-layer coating according to some embodiments of the current invention, composed of alternate layers of $Al_2O_3$ and an aluminium alkoxide alloy polymer, can produce coated QD-containing beads exhibiting superior optical performance lifetimes and thermal stability, owing to a substantially defect-free, thick gas-barrier coating. By depositing the multi-layered coating on the surface of each individual QD-containing polymer bead, the QD-beads can be incorporated into light-emitting devices without risk of damage to other device components that may be incurred when employing prior art methods, whereby optoelectronic devices are encapsulated post-assembly.

In an alternative embodiment, one or more of the surface coating may be produced in situ on the surface of the primary particles. By way of non-limiting example, a surface of quantum dot-containing primary particles can be contacted by polymerisable monomers, which are then polymerised on the surface of the particles to produce a polymeric surface coating on the particles. One method by which contacting of the particles by the monomers may be effected is to disperse the particles within a monomer mixture, optionally including a cross-linking agent and, if necessary, a polymerisation initiator, such as a photoinitiator. Polymerisation may then be effected in any manner appropriate for the monomers being used, for example if photopolymerisable monomers are used, the polymer mixture containing the primary particles and the optional photoinitiator may subsequently be exposed to a suitable source of radiation (e.g. UV).

Figure 12:
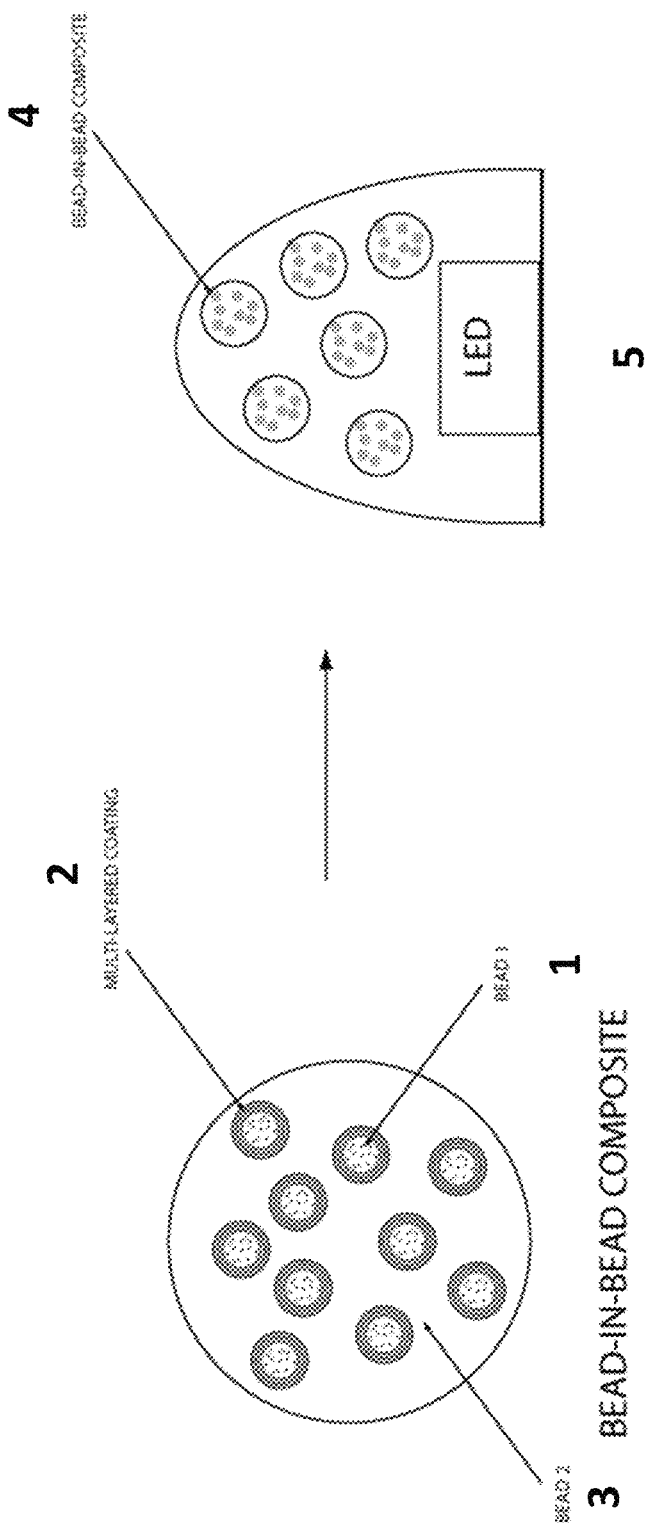
FIG. 12 illustrates a population of quantum dots entrapped within a population of primary particles in the form of polymer beads (bead i) in which each of the primary particles is provided with a multi-layered surface coating of alternate layers of, for example, inorganic and polymeric material. The coated primary particles are shown dispersed within a second type of bead (bead 2) to produce a "bead-in-bead" composite material, which can be dispersed, as shown, within a secondary matrix material in the form of an LED encapsulant disposed on an LED to provide a light-emitting device.

Various embodiments of coated QD-containing primary particles provided with a protective surface coating are depicted in FIG. 10 to FIG. 13. FIG. 12 illustrates a population of quantum dots entrapped within a primary particle (1) in the form of a polymer bead. The primary particle (1) is provided with a multi-layered surface coating of, for example, alternating layers of inorganic barrier and polymeric spacer material (coatings 1 (2) and 2 (3), interchangeably), before being dispersed within a secondary matrix material in the form of an LED encapsulant deposited on an LED to provide a light-emitting device (4) according to an embodiment of the present invention.

FIG. 11 illustrates a population of quantum dots entrapped within a primary particle in the form of a polymer bead (1) made from a first type of polymer (polymer 1), which is encapsulated within a buffer layer (2) of a second type of polymer material (polymer 2) to form a secondary particle. The surface of the secondary particle is provided with a multi-layered protective surface coating of alternate layers of, for example, inorganic barrier and polymeric spacer material (coatings 1 (3) and 2 (4), interchangeably). The encapsulated primary particles are then dispersed within a secondary matrix material in the form of an LED encapsulant disposed on an LED to provide a light-emitting device (5).

FIG. 12 illustrates a population of quantum dots entrapped within a population of primary particles in the form of polymer beads (bead 1, (1)) in which each of the primary particles is provided with a multi-layered surface coating (2) of alternate layers of, for example, inorganic barrier and polymeric spacer material according to an embodiment of the present invention. The coated primary particles are shown dispersed within a second type of bead (bead 2, (3)) to produce a "bead-in-bead" composite material (4), which can be dispersed, as shown, within a secondary matrix material in the form of an LED encapsulant disposed on an LED to provide a light-emitting device (5).

Figure 13:
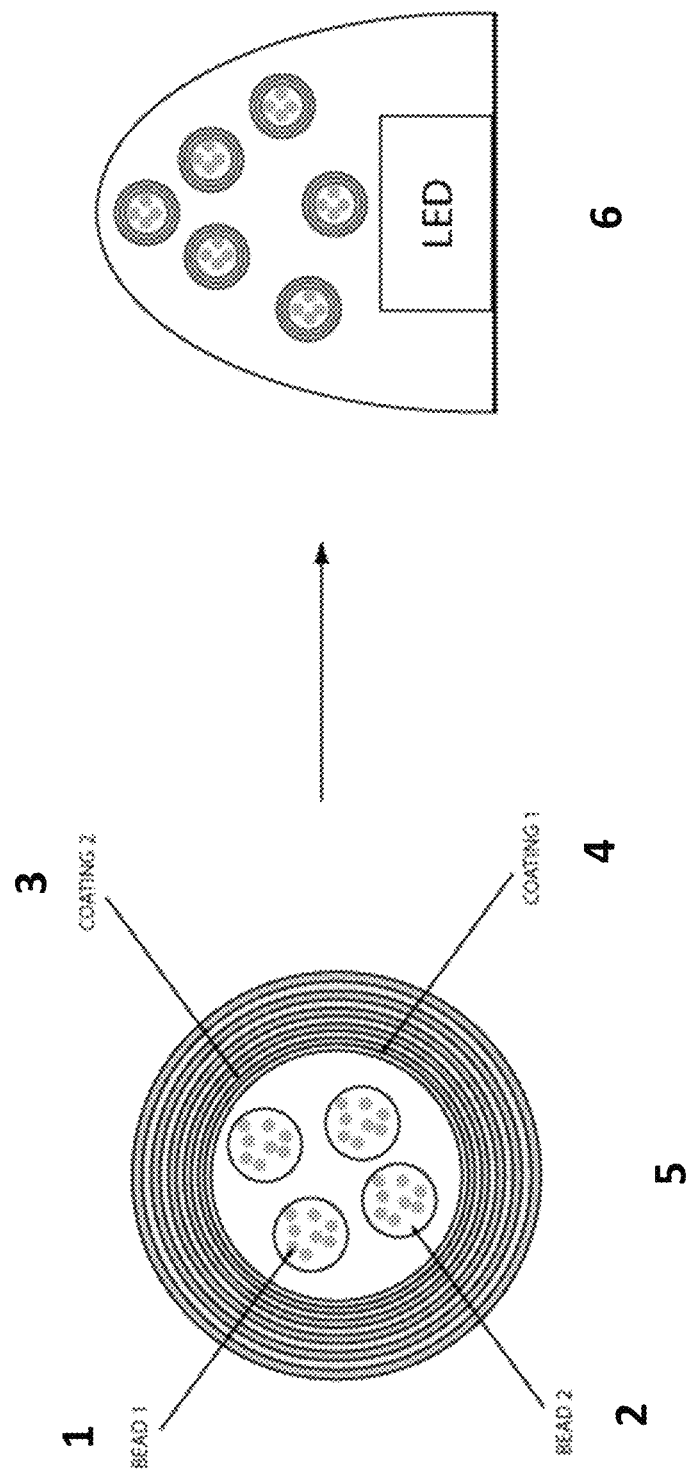
FIG. 13 shows a population of quantum dots entrapped within a population of primary particles in the form of polymer beads. The population of primary particles is dispersed within a second type of bead to produce a "bead-in-bead" composite material, which is itself coated with a multi-layered surface coating of alternate layers of, for example, inorganic and polymeric layers (coatings 1 and 2, interchangeably) according to an embodiment of the present invention. The coated bead-in-bead composite material can then be dispersed within a secondary matrix material as shown in the form of an LED encapsulant disposed on an LED to provide a light-emitting device according to an embodiment of the present invention.

FIG. 13 shows a population of quantum dots entrapped within a population of primary particles in the form of polymer beads ((1) and (2)). The population of primary particles is dispersed within a second type of bead to produce a "bead-in-bead" composite material (5), which is itself coated with a multi-layered surface coating of alternate layers of, for example, inorganic barrier and polymeric spacer layers (coatings 1 (3) and 2 (4), interchangeably) according to an embodiment of the present invention. The coated bead-in-bead composite material (5) can then be dispersed within a secondary matrix material as shown in the form of an LED encapsulant disposed on an LED to provide a light-emitting device (6) according to an embodiment of the present invention.

Application of Coated QD-Beads—Incorporation into LED Encapsulant. While the provision of a surface coating to beads containing quantum dots has many advantages as outlined above, one significant advantage is that coated quantum dot-beads (coated QD-beads) can be incorporated into commercially available LED encapsulant materials simply by weighing the desired amount of coated QD-bead material and adding this to the desired amount of LED encapsulant material. Methods to incorporate coated QD-beads into an LED encapsulant material and subsequent formation of a light-emitting device, including suitable LED encapsulation materials, and methods of colour indexing and colour rendering, as detailed in the applicant's co-pending US Patent Application Pub. No. 2011/0068322, are applicable for use with the coated QD-beads described in the disclosure.

EXAMPLES

Example 1 below describes the preparation of metal oxide ALD-coated quantum dot-containing beads under full-pulsing conditions, which could, for example, be in used in the fabrication of new, improved quantum dot-based light-emitting devices. Example 2 below describes the preparation of metal oxide ALD-coated quantum dot-containing beads under half-pulsing conditions.

Example 3 below describes the preparation of inorganic-barrier ALD-coated quantum dot-containing beads under full-pulsing conditions.

Example 4 describes the preparation of hybrid inorganic-organic polymer alloy ALD-coated quantum dot-containing beads under full-pulsing conditions.

The ALD processes described in Example 3 and Example 4 can be combined to form a multi-layer coating as described in Example 5.

Alternatively, the ALD process described in Examples 1-4 can be combined with a complementary technique to deposit two or more different types of coating material, alternately, to form a multi-layered coating.

Methods for the preparation of quantum dots, as described in the Applicant's granted U.S. Pat. Nos. 7,803,423, 7,588,828 and 7,867,556, may be employed, though the invention is not restricted to quantum dots synthesized by these techniques. The quantum dots may be synthesized by any technique known to those skilled in the art. Moreover, any technique known to those skilled in the art to incorporate quantum dots into polymer microbeads may be employed in the present invention. Non-limiting examples of suitable QD-bead formation methods are described in the Applicant's co-pending U.S. Patent Application Nos. 2010/0113813 and 2011/0068321 may be used.

Example 1

Preparation of metal oxide ALD-coated quantum dot-containing beads under full-pulsing conditions. Red-emitting InP/ZnS/ZnO core/multishell quantum dots ($PL_{max}$= 606 nm, FWHM=58 nm, PLQY=82%), were incorporated into poly(lauryl methacrylate) microbeads coated with a trimethylolpropane trimethacrylate shell, prepared via suspension polymerisation in $PVA/H_2O$ solution.

The QD-containing acrylate beads were loaded into an ALD reactor with in a cartridge with a 50 μm pore size top frit and a 150 μm pore size bottom flit. ALD was carried out under full-pulsing conditions, applying a 2,000 sccm $N_2$ boost during TMA and $H_2O$ pulses. $N_2$ was used as a carrier gas and as the purge between reactant exposures.

The $Al_2O_3$ coating was grown at 80° C., using a total of 500 ALD cycles. The total number of cycles was made up of a 30 cycle primer layer, followed by mechanical disaggregation, and then two further steps of 235 ALD cycles followed by mechanical disaggregation. Each cycle comprised the following steps:

1) 0.8 s TMA dose; 100 sccm $N_2$ purge gas through all precursor lines except for a 2,000 sccm $N_2$ pulse through both the TMA line and water precursor lines, for agitation of the beads
2) 1 s $N_2$ purge
3) Repeat steps 1 and 2 twice further
4) 0.8 s TMA dose; 100 sccm $N_2$ purge gas through all precursor lines except for a 2,000 sccm $N_2$ pulse through both the TMA line and water precursor lines, for agitation of the beads
5) 125 s $N_2$ purge
6) 0.8 s $H_2O$ dose; 100 sccm $N_2$ purge gas through all the precursor lines except for a 2,000 sccm $N_2$ pulse through both the TMA line and water precursor lines, for agitation of the beads
7) 1 s $N_2$ purge
8) Repeat steps 6 and 7 twice further
9) 0.8 s $H_2O$ dose; 100 sccm $N_2$ purge gas through all the precursor lines except for a 2,000 sccm $N_2$ pulse through both the TMA line and water precursor lines, for agitation of the beads
10) 150 s $N_2$ purge.

The 2,000 sccm $N_2$ boosts were applied 0.3 s after the start of each precursor dose.

Incorporation of quantum dot-containing acrylate beads into light-emitting devices. In a nitrogen-filled glove box, the QD-containing acrylate beads were combined with a commercially-available silicone resin (SCR1011, Shin-Etsu Chemicals Co., Ltd.) in the presence of a Pt catalyst. After mixing thoroughly, the solution was transferred to LED cases and allowed to cure for 48 hours at ambient temperature.

Figure 14:
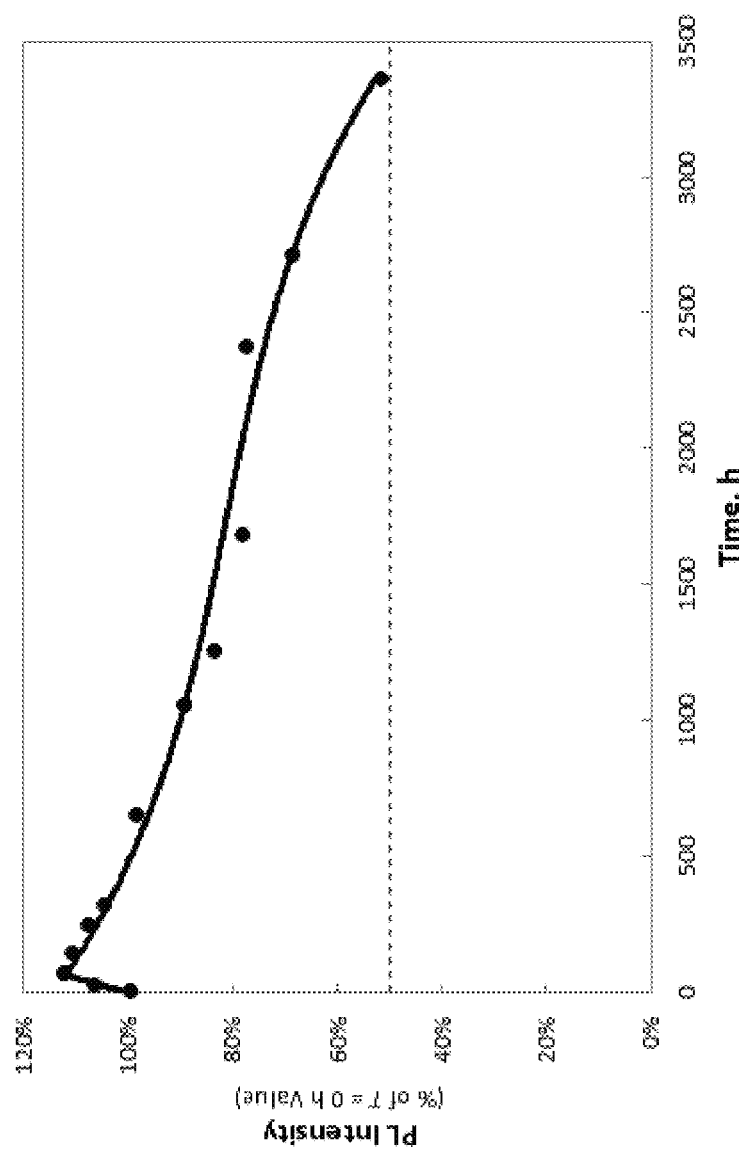
FIG. 14 shows photoluminescence lifetime data for LED devices fabricated from $Al_2O_3$-coated QD-beads following 500 ALD cycles (described in Example 1) with a PL intensity half-life ($T_{50}$) of about 3,300 hours.
Figure 15:
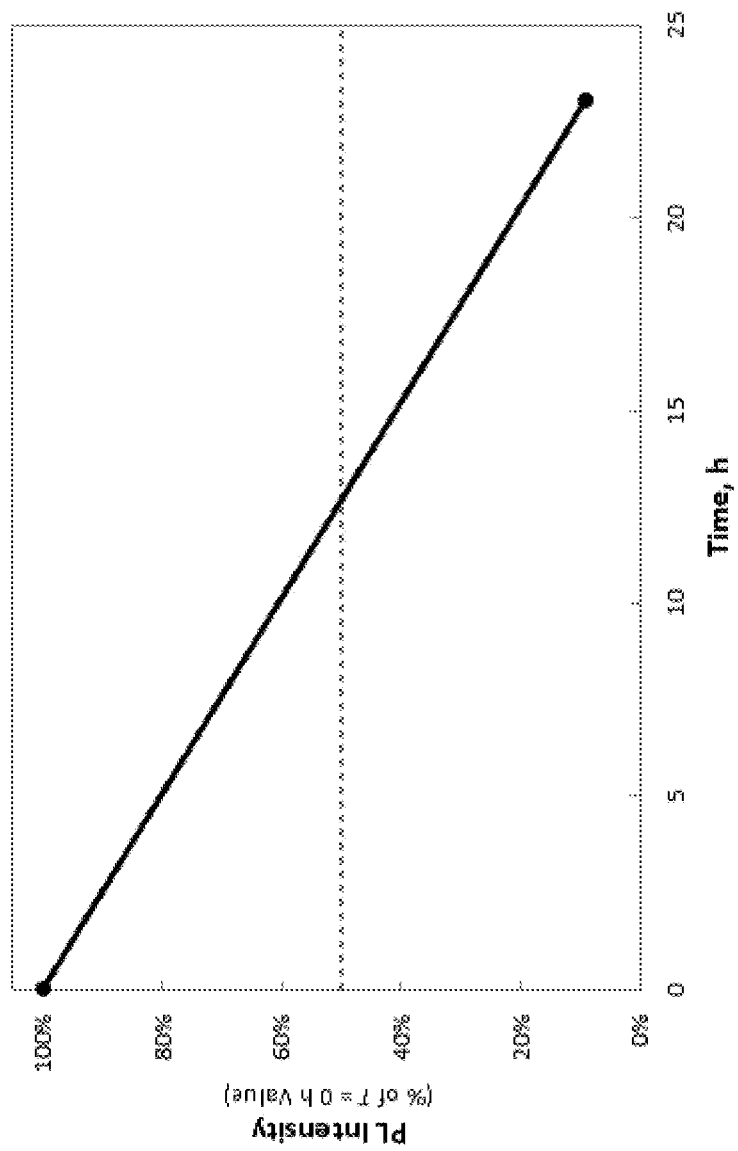
FIG. 15 shows photoluminescence lifetime data for LED devices fabricated using the same batch of QD-beads as those shown in FIG. 14, but without the ALD coating.

The PL intensity half-life ($T_{50}$) for the LED devices was about 3,300 h (FIG. 14), an approximately 250-fold improvement compared to that of LED devices made using the same batch of QD-containing beads but without the ALD coating (FIG. 15).

Example 2

Coating quantum dot-containing acrylate beads with $Al_2O_3$ using half-pulsing ALD. QD-containing acrylate beads were loaded into an ALD reactor with a 50 μm pore size top frit and a 150 μm pores size bottom fit. ALD was carried out under half-pulsing conditions, applying a 2,000 sccm $N_2$ boost during TMA pulses. $N_2$ was used as a carrier gas and as the purge between reactant exposures.

The $Al_2O_3$ coating was grown at 80° C., using a total of 500 ALD cycles. The total number of cycles was made up of a 30 cycle primer layer, followed by mechanical disaggregation, and then two further steps of 235 ALD cycles followed by mechanical disaggregation. Each cycle comprised the following steps:

1) 150 sccm $N_2$ line flow through the $H_2O$ line and one spare line, and 50 sccm through the TMA line and one spare line, 0.2 s $H_2O$ dose
2) 0.5 s $N_2$ purge
3) Repeat steps 1 and 2 eighteen times further
4) 150 sccm $N_2$ line flow through the $H_2O$ and one spare line, and 50 sccm through the TMA line and one spare line, 0.2 s $H_2O$ dose
5) 120 s $N_2$ purge
6) 0.8 s TMA dose; 50 sccm $N_2$ purge gas through the TMA line and one spare line, and 150 sccm through the $H_2O$ line and one spare line. A 2,000 sccm $N_2$ pulse was applied through both the TMA line and water precursor lines, for agitation of the beads
7) 1 s $N_2$ purge
8) Repeat steps 6 and 7 twice further
9) 0.8 s TMA dose; 50 sccm $N_2$ purge gas through the TMA line and one spare line, and 150 sccm through the $H_2O$ line and one spare line. A 2,000 sccm $N_2$ pulse was applied through both the TMA line and H$_2$O precursor lines, for agitation of the beads 10) 164.7 s N$_2$ purge.

The N$_2$ boosts were applied 0.3 s into each TMA dose.

Example 3

Coating quantum dot-containing acrylate beads with aluminium oxide barrier layer via full-pulsing ALD. The QD-containing acrylate beads were loaded into an ALD reactor with a 50 μm pore size top frit and a 150 μm pore size bottom flit. ALD was carried out under full-pulsing conditions, applying a 250 sccm N$_2$ boost during precursor pulses. N$_2$ was used as a precursor carrier gas and as the purge gas between reactant exposures.

The aluminium oxide barrier coating was grown at 80° C., using a total of 250 ALD cycles. The total number of cycles consisted of a 30 cycle primer layer, followed by sieving, and then 220 cycles to complete the layer. Each cycle comprised the following steps:

1) 0.8 s TMA dose; 100 sccm N$_2$ purge gas through all the precursor lines except for a 1.3 s 250 sccm N$_2$ pulse through the TMA line for agitation of the beads
2) 0.5 s N$_2$ purge
3) Repeat steps 1 and 2 twice further
4) 0.8 s TMA dose; 100 sccm N$_2$ purge gas through all the precursor lines except for a 1.3 s 250 sccm N$_2$ pulse through the TMA line for agitation of the beads
5) 120 s N$_2$ purge
6) 0.8 s H$_2$O dose; 100 sccm N$_2$ purge gas through all the precursor lines except for a 1.3 s 250 sccm N$_2$ pulse through water precursor line for agitation of the beads
7) 0.5 s N$_2$ purge
8) Repeat steps 6 and 7 twice further
9) 0.8 s H$_2$O dose; 100 sccm N$_2$ purge gas through all the precursor lines except for a 1.3 s 250 sccm N$_2$ pulse through water precursor line for agitation of the beads
10) 120 s N$_2$ purge.

The N$_2$ boosts were applied 0.0 s into each precursor dose.

Example 4

Coating quantum dot-containing acrylate beads with aluminium alkoxide alloy polymer spacer layer via full-pulsing ALD. The QD-containing acrylate beads were loaded into an ALD reactor with a 50 μm pore size top frit and a 150 μm pore size bottom frit. ALD was carried out under full-pulsing conditions, applying a 250 sccm N$_2$ boost during precursor pulses. N$_2$ was used as a precursor carrier gas and as the purge gas between reactant exposures. The ethylene glycol precursor was heated to 80° C. prior to injection into the reaction chamber.

The aluminium alkoxide alloy polymer coating was grown at 80° C., using a total of 125 ALD cycles. The total number of cycles consisted of a 15 cycle primer layer, followed by sieving, and then 110 cycles to complete the layer. Each cycle comprising the following steps:

1) 0.8 s TMA dose; 100 sccm N$_2$ purge gas through all the precursor lines except for a 1.3 s, 250 sccm N$_2$ pulse through the TMA line for agitation of the beads.
2) 0.5 s N$_2$ purge
3) Repeat steps 1 and 2 twice further
4) 0.8 s TMA dose; 100 sccm N$_2$ purge gas through all the precursor lines except for a 1.3 s, 250 sccm N$_2$ pulse through the TMA line for agitation of the beads
5) 120 s N$_2$ purge
6) 0.8 s ethylene glycol dose; 100 sccm N$_2$ purge gas through all the precursor lines except for a 1.3 s, 250 sccm N$_2$ pulse through the ethylene glycol line for agitation of the beads
7) 0.5 s N$_2$ purge
8) Repeat steps 6 and 7 twice further
9) 0.8 s ethylene glycol dose; 100 sccm N$_2$ purge gas through all the precursor lines except for a 1.3 s, 250 sccm N$_2$ pulse through the ethylene glycol line for agitation of the beads
10) 180 s N$_2$ purge.
11) 0.8 s TMA dose; 100 sccm N$_2$ purge gas through all the precursor lines except for a 1.3 s, 250 sccm N$_2$ pulse through the TMA line for agitation of the beads
12) 0.5 s N$_2$ purge
13) Repeat steps 11 and 12 twice further
14) 0.8 s TMA dose; 100 sccm N$_2$ purge gas through all the precursor lines except for a 1.3 s, 250 sccm N$_2$ pulse through the TMA line for agitation of the beads
15) 120 s N$_2$ purge
16) 0.8 s H$_2$O dose; 100 sccm N$_2$ purge gas through all the precursor lines except for a 1.3 s 250 sccm N$_2$ pulse through the water precursor line for agitation of the beads
17) 0.5 s N$_2$ purge
18) Repeat steps 16 and 17 twice further
19) 0.8 s H$_2$O dose; 100 sccm N$_2$ purge gas through all the precursor lines except for a 1.3 s, 250 sccm N$_2$ pulse through the water precursor line, for agitation of the beads
20) 120 s N$_2$ purge.

The N$_2$ boosts were applied 0.0 s into each precursor dose.

Example 5

Coating quantum dot-containing acrylate beads with a multi-layer Al$_2$O$_3$/Aluminium Alkoxide Alloy Polymer/Al$_2$O$_3$ Coating Via Full-Pulsing ALD.

1) A 250 total cycle aluminium oxide layer as described in Example 3, formed by a 30 cycle primer layer, followed by sieving, followed by 220 cycles.
2) A 125 total cycle aluminium alkoxide alloy polymer spacer layer as described in Example 4, consisting of 15 cycle primer layer, followed by sieving, followed by 110 cycles.
3) A 250 total cycle aluminium oxide layer as described in Example 3. In this case the 250 cycles were completed without a primer layer.

Figure 16:
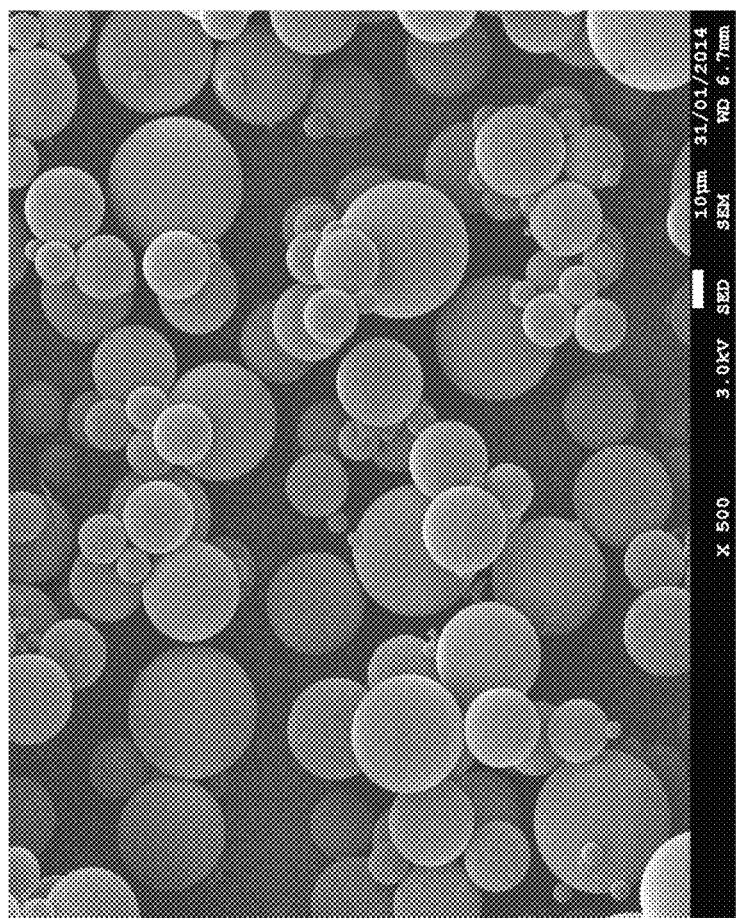
FIG. 16 shows an SEM image of QD-beads coated with a substantially defect-free multi-layer coating comprising aluminium oxide/aluminium alkoxide polymer/aluminium oxide, as described in Example 5.

An SEM image of the QD-beads formed in this way is shown in FIG. 16. The coating appears to be substantially defect-free.

Example 6

The ALD coating process with a pulsed agitation bed is illustrated by the following, non-limiting example:

In the ALD coating of micron-sized powder grains, using trimethylaluminium (TMA) and water (H$_2$O) as ALD precursors, the following process parameters may be used:

1) Inert purge gas (e.g. N$_2$ or Ar) flow rate: 400-600 sccm
2) Inert gas (e.g. N$_2$ or Ar) agitation pulse flow rate: 2,000-6,000 sccm
3) Inert gas (e.g. N$_2$ or Ar) agitation pulse time: 0.1-5 s
4) ALD precursor (TMA, H$_2$O) pulse times: 0.1-4 s
5) Number of ALD precursor (TMA, H$_2$O) pulses per ALD cycle: 1-100, for example 1-10

6) Inert gas (e.g. N₂ or Ar) purge time between ALD precursor pulses: 120-180 s

Figure 17:
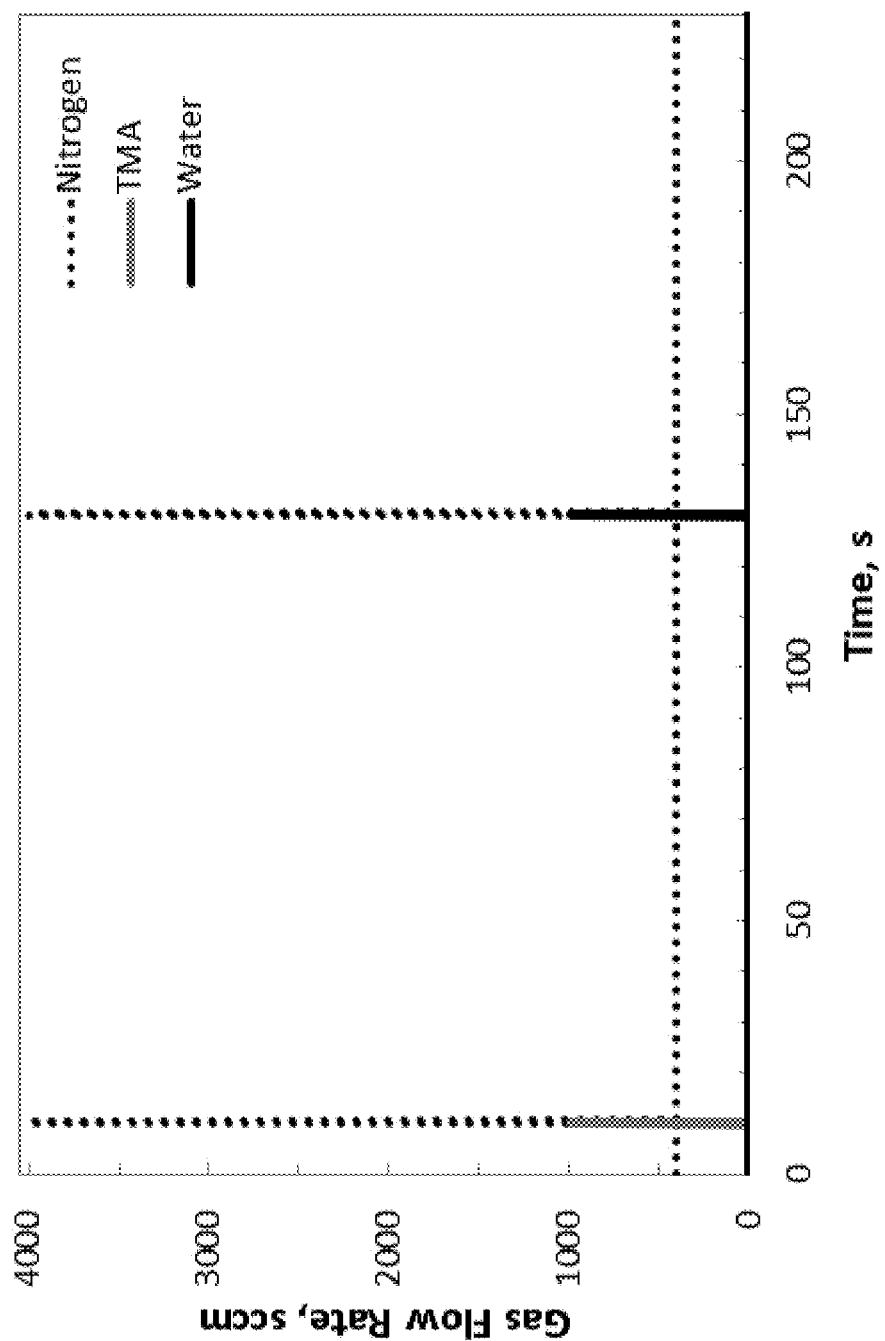
FIG. 17 shows gas flow rates used in Example 6.
Figure 18:
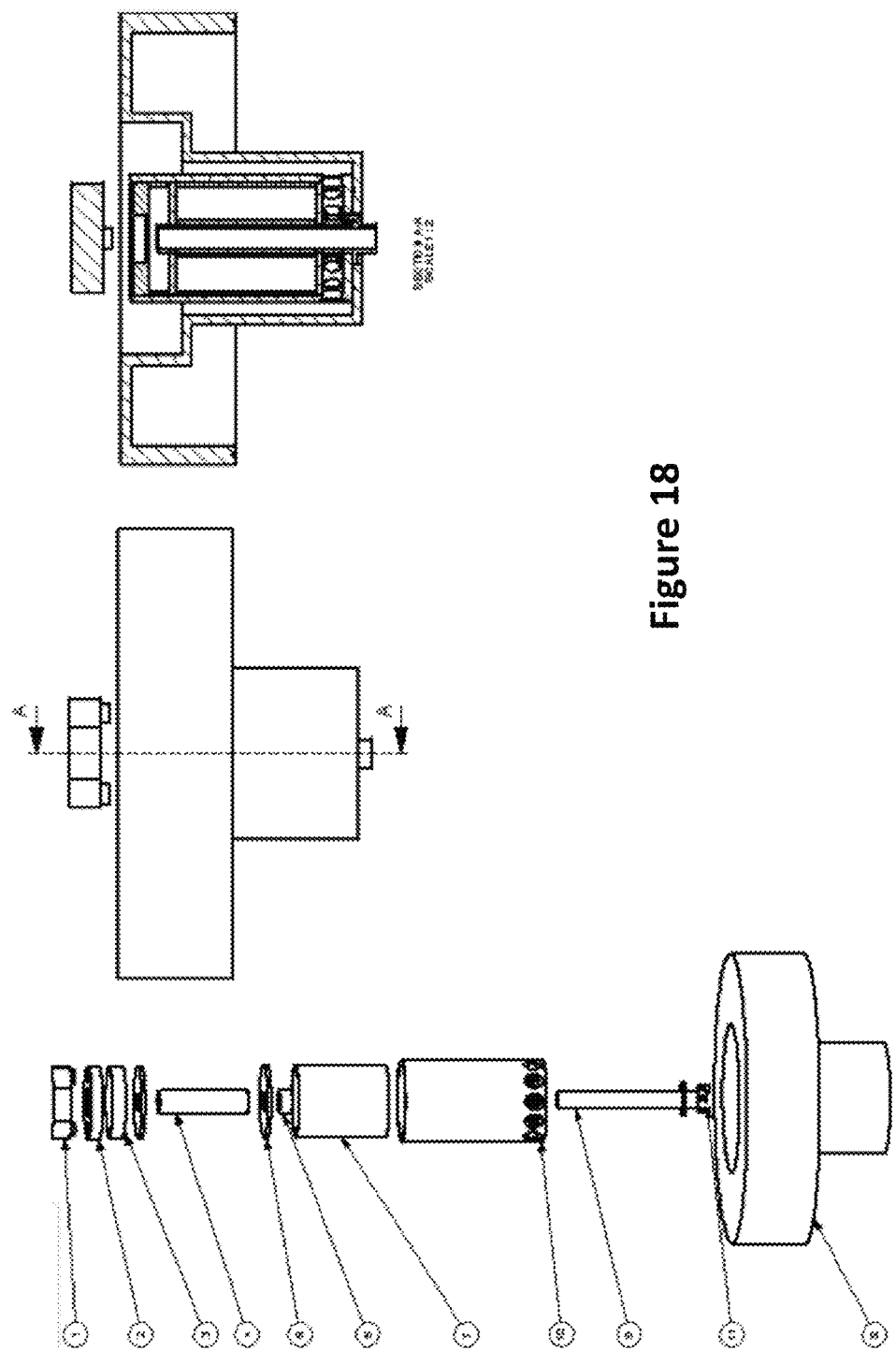
FIG. 18 shows an apparatus for ALD coating of nanoparticles.

An example of the precursor dose timings is shown in FIG. 17. FIG. 18 illustrates the apparatus used in this example, comprising: (1) a locking cap hand tool; (2) a locking cap; (3) a top collar; (4) an inner/straight collar, (5) a small/inner collar; (6) filter disks; (7) an outer/straight collar; (8) and ALD reactor carrier; (9) an exhaust (10) an ALD reactor can; and (11) socket cap head screws.

We claim:

1. A composition of matter comprising a plurality of beads, wherein each bead comprises:
   a primary matrix material;
   a population of quantum dot nanoparticles incorporated into the primary matrix material; and
   a multi-layer surface coating on each bead, the multi-layer surface coating comprising at least two barrier layers separated by at least one spacer layer.

2. The composition of matter recited in claim 1 wherein the quantum dot nanoparticles are semiconductor nanoparticles.

3. The composition of matter recited in claim 1 wherein the quantum dot nanoparticles comprise indium and phosphorus.

4. The composition of matter recited in claim 1 wherein the quantum dot nanoparticles are essentially free of cadmium.

5. The composition of matter recited in claim 1 wherein the primary matrix material is silica, a resin, a polymer, a monolith, a glass, a sol-gel, an epoxy, a silicone, or a (meth)acrylate.

6. The composition of matter recited in claim 1 wherein the multi-layer surface coating comprises alternating inorganic and polymer layers.

7. The composition of matter recited in claim 1 wherein at least one barrier layer comprises an inorganic material.

8. The composition of matter recited in claim 1 wherein at least one spacer layer comprises a polymer.

9. The composition of matter recited in claim 1 wherein at least one barrier layer is comprised of an inorganic material.

10. The composition of matter recited in claim 1 wherein at least one spacer layer is comprised of a polymer.

11. The composition of matter recited in claim 1 wherein an innermost layer of the multi-layer surface coating is a barrier layer.

12. The composition of matter recited in claim 1 wherein an innermost layer of the multi-layer surface coating is a spacer layer.

13. The composition of matter recited in claim 1 wherein an outermost layer of the multi-layer surface coating comprises an inorganic layer.

14. The composition of matter recited in claim 1 wherein an outermost layer of the multi-layer surface coating comprises a polymer layer.

15. The composition of matter recited in claim 1 wherein at least one barrier layer comprises aluminum oxide.

16. The composition of matter recited in claim 1 wherein at least one spacer layer comprises an aluminum alkoxide polymer.

17. The composition of matter recited in claim 1 wherein the primary matrix material comprises silica and the bead surfaces have been treated with an acrylate monomer and subsequently polymerized to provide a polymeric surface barrier layer.

18. The composition of matter recited in claim 1 wherein at least one barrier layer comprises a gas barrier.

19. The composition of matter recited in claim 1 wherein at least one barrier layer comprises a moisture barrier.

20. The composition of matter recited in claim 1 wherein at least one barrier layer comprises a free radical barrier.

21. The composition of matter recited in claim 1 wherein at least one barrier layer comprises an inorganic dielectric material, a metal oxide, a transparent conducting oxide (TCO), a metal nitride or a silica-based material.

22. The composition of matter recited in claim 1 wherein at least one barrier layer comprises a single metal oxide consisting of oxide ions combined with a single type of metal ion, or a mixed metal oxide consisting of oxide ions combined with two or more types of metal ion, or a doped metal oxide, or a doped transparent conducting oxide (TCO).

23. The composition of matter recited in claim 1 wherein at least one barrier layer comprises a material selected from the group consisting of Al-doped ZnO, Ga-doped ZnO, $SrTiO_3$, $Al_2O_3$, ZnO, $HfO_2$, $SiO_2$, $ZrO^2$, $TiO_2$, $In_2O_3$ and silica.

24. The composition of matter recited in claim 1 wherein at least one spacer layer comprises a material selected from the group consisting of hydrophilic polymers, hydroxy-terminated polymers, polyvinyl alcohols, ethylene vinyl alcohols, poly(vinyl alcohol-co-ethylene), (meth)acrylates, poly(hydroxyethylmethacrylate), poloxamers, poly(vinylpyrrolidone), poly(ethers), glycerol poly(oxalate), poly(methylvinylether), poly(epoxysuccinic acid), poly(ethylene glycol), poly(thioethers), poly(thiophene), poly(3,4-ethylenedioxythiophene), poly(thiols), poly(vinyl acids), poly(vinyl acetate), poly(vinylphosphonic acid), poly(vinyl sulphate), poly(amides), poly(acrylamide), poly(ethyloxazoline), poly(esters), and fumed silica. Suitable polymer coating materials include poly (vinyl alcohols), ethylene vinyl alcohols, poly(hydroxyethylmethacrylates), poly(vinylpyrrolidone), poly(ethylene glycol) and fumed silica.

25. The composition of matter recited in claim 1 wherein the multi-layer surface coating comprises an innermost buffer layer comprising a material different from the primary matrix material.

26. The composition of matter recited in claim 25 wherein the buffer layer comprises a material selected from the group consisting of polymers having hydroxyl-terminated groups, cross-linkers having hydroxyl-terminated groups, poly(ethers), poly(thioethers), poly(thiols), poly(carbonyls), poly(esters), poly(am ides), and trimethylolpropane trimethacrylate (TMPTMA).

27. The composition of matter recited in claim 25 wherein the primary matrix material comprises poly(lauryl methacrylate) and the buffer layer is a cross-linker buffer layer applied to the surface of the beads via suspension polymerization in a poly(vinyl acetate)/water solution prior to the deposition of an $Al^2O_3$ barrier layer.

28. The composition of matter recited in claim 1 wherein each bead comprises about 1000 to about 10,000 nanoparticles.

29. The composition of matter recited in claim 1 wherein each bead comprises about 10,000, to about 100,000 quantum dot nanoparticles.

* * * * *